(12) United States Patent
Tanaka et al.

(10) Patent No.: US 11,610,957 B2
(45) Date of Patent: Mar. 21, 2023

(54) DISPLAY DEVICE

(71) Applicant: SAMSUNG DISPLAY CO., LTD., Yongin-si (KR)

(72) Inventors: Tetsuhiro Tanaka, Hwaseong-si (KR); Yeong-Gyu Kim, Seoul (KR); Tae Sik Kim, Hanam-si (KR); Hee Yeon Kim, Daegu (KR); Ki Seong Seo, Seoul (KR); Seung Hyun Lee, Asan-si (KR); Kyeong Woo Jang, Seoul (KR); Sug Woo Jung, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 95 days.

(21) Appl. No.: 17/160,562

(22) Filed: Jan. 28, 2021

(65) Prior Publication Data
US 2021/0257426 A1    Aug. 19, 2021

(30) Foreign Application Priority Data
Feb. 14, 2020    (KR) ........................ 10-2020-0018393

(51) Int. Cl.
| | | |
|---|---|---|
| H01L 27/00 | (2006.01) | |
| H01L 29/00 | (2006.01) | |
| H01L 27/32 | (2006.01) | |
| H01L 29/786 | (2006.01) | |

(52) U.S. Cl.
CPC ...... *H01L 27/3258* (2013.01); *H01L 29/7869* (2013.01)

(58) Field of Classification Search
CPC ............. H01L 27/3258; H01L 27/3248; H01L 27/1225; H01L 29/7869; H01L 29/78603; H01L 29/78633; H01L 29/78606
See application file for complete search history.

(56) References Cited

U.S. PATENT DOCUMENTS

2021/0202634 A1*  7/2021  Moon ................ H01L 27/3262

FOREIGN PATENT DOCUMENTS

| | | |
|---|---|---|
| JP | 2018-093082 | 6/2018 |
| KR | 10-2019-0000785 | 1/2019 |
| KR | 10-2019-0042132 | 4/2019 |

* cited by examiner

*Primary Examiner* — Nikolay K Yushin
(74) *Attorney, Agent, or Firm* — F. Chau & Associates, LLC

(57) ABSTRACT

A display device includes a first thin film transistor disposed on a substrate. A first insulating interlayer covers the first thin film transistor. An active pattern is disposed on the first insulating interlayer. The active pattern includes indium-gallium-zinc oxide (IGZO) having a thickness in a range of about 150 Å to about 400 Å. A gate insulation layer covers the active pattern. A gate pattern is disposed on the gate insulation layer. A second insulating interlayer covers the gate pattern.

18 Claims, 11 Drawing Sheets

DISPLAY DEVICE

This application claims priority under 35 U.S.C. § 119 to Korean Patent Application No. 10-2020-0018393, filed on Feb. 14, 2020 in the Korean Intellectual Property Office, the disclosure of which is incorporated by reference in its entirety herein.

1. TECHNICAL FIELD

Exemplary embodiments of the present inventive concepts are directed to a display device. More particularly, exemplary embodiments of the present inventive concepts are directed to an organic light emitting display (OLED) device and a method for manufacturing the same.

2. DISCUSSION OF RELATED ART

An OLED device is a self-emission display device that does not require a separate light source, such as a backlight. Therefore, the OLED device may have a reduced thickness, and may be suitable for implementing a flexible display device. Therefore, OLED devices have become increasingly popular.

In recent developments, the OLED device may have a unit pixel including a silicon based thin film transistor and an oxide based thin film transistor to drive pixels of the OLED device using a low power.

SUMMARY

One or more exemplary embodiment of the present inventive concepts provides a display device with improved reliability.

One or more exemplary embodiments of the present inventive concepts provides a method for manufacturing the display device.

According to an exemplary embodiment of the present inventive concepts, a display device includes a first thin film transistor disposed on a substrate. A first insulating interlayer covers the first thin film transistor. An active pattern is disposed on the first insulating interlayer. The active pattern includes indium-gallium-zinc oxide (IGZO) having a thickness in a range of about 150 Å to about 400 Å. A gate insulation layer covers the active pattern. A gate pattern is disposed on the gate insulation layer. A second insulating interlayer covers the gate pattern.

In an exemplary embodiment, a refractive index of the active pattern may be 1.92 to 1.93 at a wavelength of 632 nm.

In an exemplary embodiment, a density of the active pattern may be higher than 6.3 g/cm$^3$ and lower than 6.6 g/cm$^3$.

In an exemplary embodiment, the first insulating interlayer may include a lower first insulating interlayer including silicon nitride and an upper first insulating interlayer including silicon oxide.

In an exemplary embodiment, a thickness of the lower first insulating interlayer may be 300 Å to 3,000 Å, and a thickness of the upper first insulating interlayer may be 50 Å to 5,000 Å.

In an exemplary embodiment, an NO$_2$ spin density of the upper first insulating interlayer may be lower than 5 E+16 spins/cm$^3$.

In an exemplary embodiment, a concentration of hydrogen in the upper first insulating interlayer may be higher than 3.0 E+20 atom/cm$^3$ and lower than 9.9 E+20 atom/cm$^3$.

In an exemplary embodiment, the second insulating interlayer may include a lower second insulating interlayer including silicon oxide and an upper second insulating interlayer including silicon nitride.

In an exemplary embodiment, a thickness of the lower second insulating interlayer may be 500 Å to 5,000 Å.

In an exemplary embodiment, a thickness of the upper second insulating interlayer may be 1000 Å to 5,000 Å.

In an exemplary embodiment, a concentration of hydrogen in the upper second insulating interlayer may be 1.19 E+22 atom/cm$^3$ to 1.28 E+22 atom/cm$^3$.

In an exemplary embodiment, a concentration of hydrogen in the gate insulation layer may be higher than 3.0 E+20 atoms/cm$^3$ and lower than 1.2 E+21 atoms/cm$^3$.

In an exemplary embodiment, an NO$_2$ spin density of the gate insulation layer may be lower than 1.6 E+19 spins/cm$^3$.

In an exemplary embodiment, a display device includes a first active pattern. A first gate insulation layer covers the first active pattern. A first gate pattern is disposed on the first gate insulation layer. A second gate insulation layer covers the first gate pattern. A second gate pattern is disposed on the second gate insulation layer. A first insulating interlayer covers the second gate pattern. A second active pattern is disposed on the first insulating interlayer. The second active pattern includes an oxide semiconductor material. A third gate insulation layer covers the second active pattern. A third gate pattern is disposed on the third gate insulation layer. A second insulating interlayer covers the third gate pattern. The second insulating interlayer has a lower second insulating interlayer including silicon oxide and an upper second insulating interlayer including silicon nitride.

In an exemplary embodiment, wherein the second active pattern may include indium-gallium-zinc oxide (IGZO) having a thickness of 150 Å to 400 Å.

In an exemplary embodiment, a refractive index of the second active pattern may be 1.92 to 1.93 at a wavelength of 632 nm.

In an exemplary embodiment, the first insulating interlayer includes a lower first insulating interlayer may include silicon nitride and an upper first insulating interlayer including silicon oxide.

In an exemplary embodiment, a concentration of hydrogen in the upper first insulating interlayer may be higher than 3.0 E+20 atom/cm$^3$ and lower than 9.9 E+20 atom/cm$^3$.

In an exemplary embodiment, a thickness of the upper second insulating interlayer may be 1000 Å to 5,000 Å.

In an exemplary embodiment, the third gate pattern may include a titanium layer pattern and a molybdenum layer pattern.

In an exemplary embodiment, a display device includes a driving thin film transistor disposed on a substrate. A first insulating interlayer covers the driving thin film transistor. A switching thin film transistor is disposed on the first insulating interlayer. The switching thin film transistor has a threshold voltage in a range of about −3.5V to about +2V.

According to an exemplary embodiment of the present inventive concepts, the second thin film transistor may have a high reliability and a target threshold voltage. Further, in the display device, the second thin film transistor may have low leakage currents in an off-state. Thus, when an image is maintained in the display device, off-leakage currents of the display device may be decreased, and power consumption of the display device may be decreased.

DETAILED DESCRIPTION OF EXEMPLARY EMBODIMENTS

Figure 1:
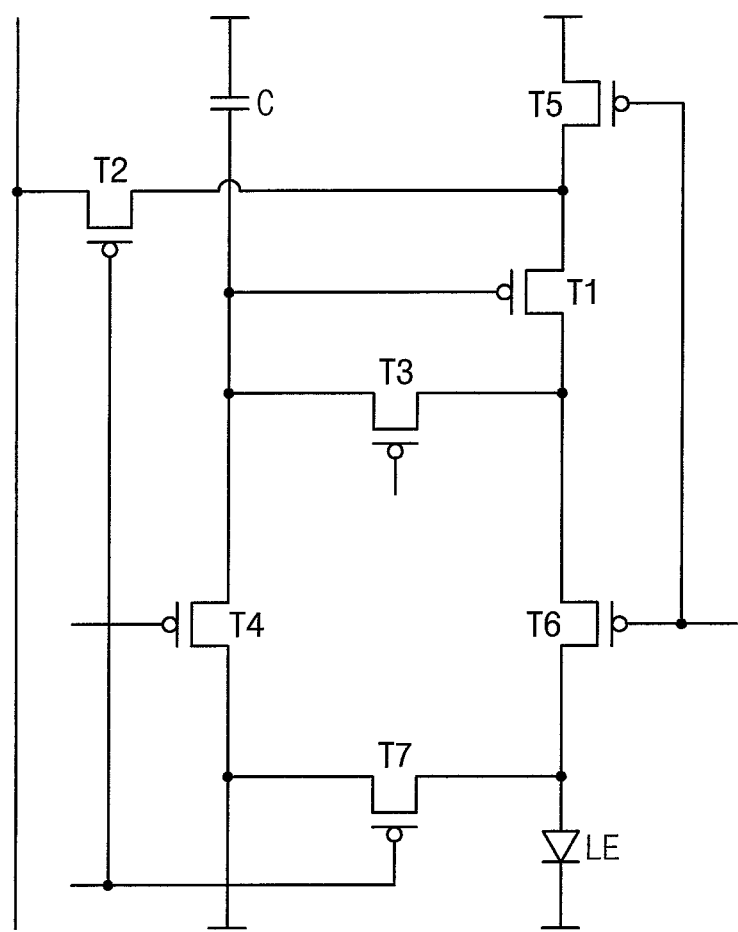
FIG. 1 is an equivalent circuit diagram illustrating a unit pixel of a display device according to an exemplary embodiment of the present inventive concepts.

Hereinafter, exemplary embodiments of the present inventive concepts will be described in detail with reference to the accompanying drawings. In the drawings, the same or similar reference numerals are used for the same or similar elements.

Figure 2:
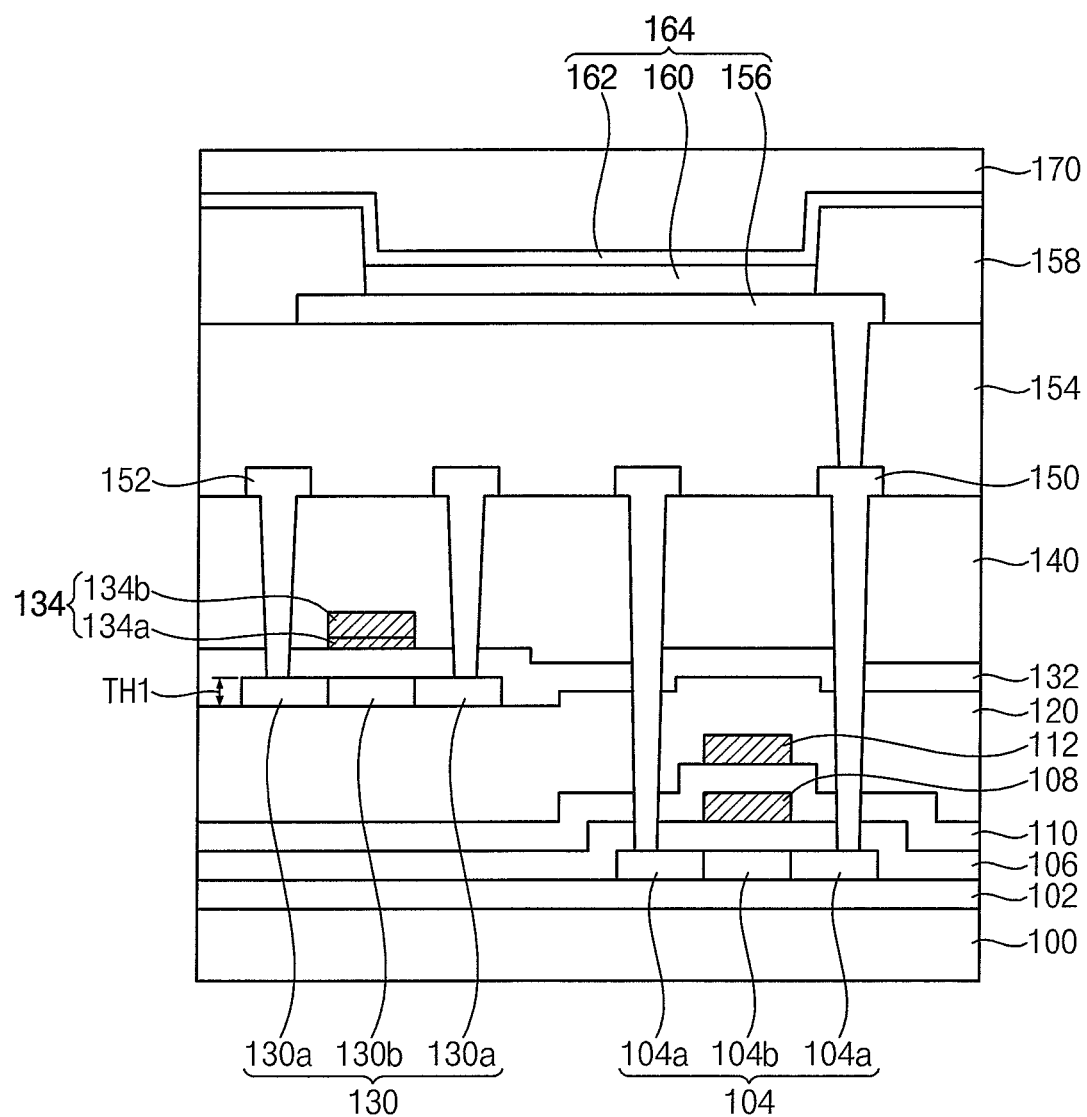
FIG. 2 is a cross-sectional view of an OLED device according to an exemplary embodiment of the present inventive concepts.

FIG. 1 is an equivalent circuit diagram illustrating a unit pixel of a display device according to an exemplary embodiment of the present inventive concepts. FIG. 2 is a cross-sectional view of an OLED device according to an exemplary embodiment of the present inventive concepts.

Referring to the exemplary embodiment of FIG. 1, a unit pixel of a display device may include a plurality of thin film transistors. For example, as shown in the exemplary embodiment of FIG. 1, the unit pixel includes first to seventh thin film transistors T1 to T7. The unit pixel also includes a capacitor C and an organic light emitting diode LE. The first to seventh thin film transistors T1 to T7 may be connected to wirings such as a gate line, a data line, and a driving voltage line, etc.

The first to seventh thin film transistors T1 to T7 may include a first plurality of thin film transistors comprising the first thin film transistor T1, second thin film transistor T2, and fifth to seventh thin film transistors T5 to T7 and a second plurality of thin film transistors comprising the third and fourth thin film transistors T3 and T4. The first plurality of thin film transistors may constitute driving thin film transistors and built-in circuits, etc, for controlling the organic light emitting diode LE. The second plurality of thin film transistors may be switching devices, such as switching thin film transistors, for switching the driving thin film transistors.

In FIG. 1, the first plurality of thin film transistors of the unit pixel include five thin film transistors (e.g., the first, second and fifth to seventh thin film transistors T1, T2, T5 to T7), and the plurality of second thin film transistors includes two second thin film transistors (e.g., the third to fourth thin film transistor T3 and T4), and one capacitor. However, exemplary embodiments of the present inventive concepts are not limited thereto and the number of each of the first and second plurality of thin film transistors and capacitors may not limited thereof. Further, in other exemplary embodiments, the specific first to seventh transistors T1 to T7 that form the driving thin film transistors and the switching thin film transistors may vary.

The first plurality of thin film transistors may be formed to stably drive against a bias stress. In an exemplary embodiment, the first plurality of thin film transistors (e.g., the first, second and fifth to seventh thin film transistors T1, T2, T5 to T7) may be silicon-based thin film transistors.

Since the second plurality of thin film transistors T3 and T4 serve as the switching devices (e.g., the switching thin film transistors), the second plurality of thin film transistors (e.g., the third to fourth thin film transistor T3 and T4) may be formed to have low leakage currents in an off-state, and to have a target threshold voltage. In an exemplary embodiment, the second plurality of thin film transistors (e.g., the third to fourth thin film transistor T3 and T4) may be oxide-based thin film transistors. However, exemplary embodiments of the present inventive concepts are not limited thereto.

The organic light emitting diode LE may include a lower electrode and an upper electrode facing each other and a light emitting layer interposed therebetween. The light emitting layer may emit light according to output signals of at least one of the first plurality of thin film transistors. For example, in an exemplary embodiment, the light emitting layer may emit light according to output signals from the sixth and seventh thin film transistors T6 to T7. Therefore, the display device may display an image by emission of the light.

The capacitor C may be connected between a gate pattern and a source electrode of one transistor of the first plurality of thin film transistors. For example, the capacitor C may be connected between a gate pattern and a source electrode of the first thin film transistor T1. The capacitor may charge and maintain input data signals of the gate pattern of the first thin film transistor T1.

Hereinafter, a cross-sectional structure of the display device according to an exemplary embodiment of the present inventive concepts is described with reference to FIG. 2.

FIG. 2 illustrates elements included in the unit pixel of the display device. The unit pixel may include the first plurality of thin film transistors, the second plurality of thin film transistors, and the capacitor.

Referring to the exemplary embodiment of FIG. 2, a buffer layer 102 may be disposed on a base substrate 100. For example, as shown in the exemplary embodiment of FIG. 2, a lower surface of the buffer layer 102 may directly contact an upper surface of the base substrate 100. A first active pattern 104 may be disposed on the buffer layer 102. For example, as shown in the exemplary embodiment of FIG. 2, a lower surface of the first active pattern 104 may directly contact an upper surface of the buffer layer 102.

In an exemplary embodiment, the base substrate 100 may include at least one material selected from glass, quartz, silicon and polymer resin, etc. For example, the polymer resin may include at least compound selected from polyethylene terephthalate, polyethylene naphthalate, polyether ketone, polycarbonate, polyarylate, polyether sulfone, polyimide, and the like. However, exemplary embodiments of the present inventive concepts are not limited thereto.

In an exemplary embodiment, the buffer layer 102 may include an inorganic material such as oxide or nitride. For example, the buffer layer 102 may have a multi-layer structure including a lower layer including silicon nitride and an upper layer including silicon oxide. However, exemplary embodiments of the present inventive concepts are not limited thereto.

In an exemplary embodiment, the first active pattern 104 may include silicon. For example, the first active pattern 104 may include polysilicon. However, exemplary embodiments of the present inventive concepts are not limited thereto.

As shown in the exemplary embodiment of FIG. 2, the first active pattern 104 may include a first channel region 104b and a first source/drain regions 104a adjacent to both lateral sides of the first channel region 104b. For example, the first source/drain regions 104a may be spaced apart from each other in a direction parallel to an upper surface of the base substrate 100 with the first channel region 104b disposed therebetween. The first source/drain regions 104a may be doped with impurities.

A first gate insulation layer 106 may be disposed on the buffer layer 102 and the first active pattern 104. The first gate insulation layer 106 may cover the buffer layer 102 and the first active pattern 104. For example, as shown in the exemplary embodiment of FIG. 2, a lower surface of the first gate insulation layer 106 may directly contact upper surfaces and lateral side surfaces of the first source/drain regions 104a and upper surfaces of the first channel region 104b and the buffer layer 102.

In an exemplary embodiment, the first gate insulation layer 106 may include silicon oxide (SiOx), silicon nitride (SiNx), silicon carbide, or a combination thereof. In another exemplary embodiment, the first gate insulation layer 106 may include an insulating metal oxide such as at least one compound selected from aluminum oxide, tantalum oxide, hafnium oxide, zirconium oxide, titanium oxide, and the like. However, exemplary embodiments of the present inventive concepts are not limited thereto.

A first gate pattern 108 may be disposed on the first gate insulation layer 106. For example, as shown in the exemplary embodiment of FIG. 2, a lower surface of the first gate pattern 108 may directly contact an upper surface of the first gate insulation layer 106. The first gate pattern 108 may be disposed to overlap the first channel region 104b of the first active pattern 104 (e.g., in a thickness direction of the base substrate 100). In an exemplary embodiment, the first gate pattern 108 may include a metal such as aluminum (Al), silver (Ag), chromium (Cr), titanium (Ti), tantalum (Ta), molybdenum (Mo), alloys thereof, or nitrides thereof, conductive metal oxides, transparent conductive materials, or the like. For example, the first gate pattern 108 may have a stacked structure including a titanium layer pattern and a molybdenum layer pattern. However, exemplary embodiments of the present inventive concepts are not limited thereto.

The first active pattern 104 may serve as an active region of the first thin film transistor T1. Therefore, the first active pattern 104, the first gate insulation layer 106, and the first gate pattern 108 may serve as one of the first plurality of thin film transistors which constitute driving thin film transistors and built-in circuits, etc, for controlling the organic light emitting diode LE.

A second gate insulation layer 110 may be disposed on the first gate insulation layer 106 and the first gate pattern 108. The second gate insulation layer 110 may cover the first gate insulation layer 106 and the first gate pattern 108. For example, as shown in the exemplary embodiment of FIG. 2, a lower surface of the second gate insulation layer 110 may directly contact an upper surface of the first gate insulation layer 106 and upper and lateral side surfaces of the first gate pattern 108. In an exemplary embodiment, the second gate insulation layer 110 may include at least one compound selected from silicon oxide, silicon nitride, silicon oxynitride, and the like. However, exemplary embodiments of the present inventive concepts are not limited thereto. The second gate insulation layer 110 may be used as a dielectric layer of a capacitor. Thus, the second gate insulation layer 110 may have a high dielectric constant to increase a storage capacity of the capacitor. For example, in an exemplary embodiment, the second gate insulation layer 110 may include silicon nitride having a dielectric constant higher than the dielectric constant of silicon oxide.

A second gate pattern 112 may be disposed on the second gate insulation layer 110. The second gate pattern 112 may overlap the first gate pattern 108 (e.g., in a thickness direction of the base substrate 100). For example, as shown in the exemplary embodiment of FIG. 2, a lower surface of the second gate pattern 112 may directly contact an upper surface of the second gate insulation layer 110. In an exemplary embodiment, the second gate pattern 112 may include a metal such as aluminum (Al), silver (Ag), chromium (Cr), titanium (Ti), tantalum (Ta), molybdenum (Mo), alloys thereof, nitrides thereof, conductive metal oxides, transparent conductive materials, or the like. For example, the second gate pattern 112 may have a stacked structure including a titanium layer pattern and a molybdenum layer pattern. However, exemplary embodiments of the present inventive concepts are not limited thereto.

The first gate pattern 108, the second gate insulation layer 110 and the second gate pattern 112 may serve as the capacitor.

A first insulating interlayer 120 may be disposed on the second gate insulation layer 110 and the second gate pattern 112. The first insulating interlayer 120 may cover the second gate insulation layer 110 and the second gate pattern 112. For example, as shown in the exemplary embodiment of FIG. 2, the lower surface of the first insulating interlayer 120 may directly contact an upper surface of the second gate insulation layer 110 and upper and lateral side surfaces of the second gate pattern 112. In an exemplary embodiment, the first insulating interlayer 120 may include at least one compound selected from silicon oxide, silicon nitride, silicon oxynitride, and the like. For example, the first insulating interlayer 120 may be a single layer including a single material. However, exemplary embodiments of the present inventive concepts are not limited thereto.

A second active pattern 130 may be disposed on the first insulating interlayer 120. For example, as shown in the exemplary embodiment of FIG. 2, a lower surface of the second active pattern 130 may directly contact an upper surface of the first insulating interlayer 120. The second active pattern 130 may serve as an active region of one of the second plurality of thin film transistors (e.g., the third thin film transistor T3 or fourth thin film transistor T4) which serve as the switching devices (e.g., the switching thin film transistors) for switching the driving thin film transistors.

The thin film transistor of the second plurality of thin film transistors may be configured to have a high reliability and a target threshold voltage. For example, the thin film transistor of the second plurality of thin film transistors may have a target threshold voltage in a range of about −3.5V to about +2V, and a stacked structure of the thin film transistor of the second plurality of thin film transistors having the target threshold voltage is described.

In an exemplary embodiment, the second active pattern 130 may include an oxide semiconductor material. For example, the second active pattern 130 may include at least one compound selected from indium (In), zinc (Zn), gallium (Ga), tin (Sn), titanium (Ti), aluminum (Al), hafnium (Hf), zirconium Oxides containing (Zr), magnesium (Mg), and the like. The second active pattern 130 may include a binary component compound (ABx), a ternary compound (ABxCy), or a tetracomponent compound (ABxCyDz). However, exemplary embodiments of the present inventive concepts are not limited thereto.

In an exemplary embodiment, the second active pattern 130 may include indium-gallium-zinc oxide (IGZO). Hereinafter, the second active pattern 130 including indium-gallium-zinc oxide (IGZO) may be described for convenience of explanation.

When the indium-gallium-zinc oxide (IGZO) is used as the second active pattern 130, electrical characteristics of the thin film transistor of the second plurality of thin film transistors may vary depending on a thickness, physical properties, and/or a composition of materials of the second active pattern 130. For example, a threshold voltage of the thin film transistor of the second plurality of thin film transistors may be changed depending on the thickness, the physical properties and/or the composition of materials of the second active pattern 130.

When the thickness TH1 (e.g., length in a thickness direction of the base substrate 100 that is perpendicular to an upper surface of the base substrate 100) of the second active pattern 130 is decreased, the threshold voltage of the thin film transistor of the second plurality of thin film transistors may be increased. Thus, the thickness TH1 of the second active pattern 130 may be adjusted so that the thin film transistor of the second plurality of thin film transistors may have the target threshold voltage (e.g., in the range of about −3.5V to about +2V). In an exemplary embodiment, the thickness of the second active pattern 130 may be in a range of about 150 Å to about 400 Å.

The second active pattern 130 may have a density and a refractive index depending on oxygen components (e.g., a total concentration of oxygen) included in the second active pattern 130. Further, the threshold voltage of the thin film transistor of the second plurality of thin film transistors may be changed by the amount of oxygen components included in the second active pattern 130. When the amount of oxygen components and a total oxygen concentration included in the second active pattern 130 is increased, the threshold voltage may be higher. Conversely, when the amount of oxygen components included in the second active pattern 130 is decreased, the threshold voltage may be lowered. Therefore, the density and the refractive index of the second active pattern 130 may be adjusted so that the thin film transistor of the second plurality of thin film transistors may have the target threshold voltage.

In an exemplary embodiment, the density of the second active pattern 130 may be greater than 6.3 g/cm$^3$ and lower than 6.6 g/cm$^3$.

When the amount of oxygen components included in the second active pattern 130 is increased and the total oxygen concentration is increased, the refractive index of the second active pattern 130 may be increased. In an exemplary embodiment, the refractive index of the second active pattern 130 may be in range of about 1.92 to about 1.93, when measured at a wavelength of 632 nm. If the refractive index of the second active pattern 130 is lower than about 1.92, the threshold voltage may be lower than the target threshold voltage. If the refractive index of the second active pattern 130 is higher than about 1.93, the threshold voltage may be higher than the target threshold voltage.

The second active pattern 130 may include a second channel region 130b, second source/drain regions 130a adjacent to both lateral sides of the second channel region 130b. For example, the second source/drain regions 130a may be spaced apart from each other in a direction parallel to an upper surface of the base substrate 100 with the second channel region 130b disposed therebetween.

A third gate insulation layer 132 may be disposed on the first insulating interlayer 120 and the second active pattern 130. The third gate insulation layer 132 may cover the first insulating interlayer 120 and the second active pattern 130. For example, as shown in the exemplary embodiment of FIG. 2, a lower surface of the third gate insulation layer 132 may directly contact an upper surface of the first insulating interlayer 120 and an upper surface and lateral side surfaces of the second active pattern 130.

In an exemplary embodiment, the third gate insulation layer 132 may include at least one compound selected from silicon oxide, silicon nitride, silicon oxynitride, and the like. Properties of the third gate insulation layer 132 may affect electrical characteristics of the thin film transistor of the second plurality of thin film transistors.

In an exemplary embodiment, the third gate insulation layer 132 may include silicon oxide.

When a concentration of hydrogen included in the third gate insulation layer 132 is increased, the threshold voltage of the thin film transistor of the second plurality of thin film transistors may be significantly lowered to have a negative value. Thus, a concentration of the hydrogen included in the third gate insulation layer 132 may be lowered so as to have the target threshold voltage of the thin film transistor of the second plurality of thin film transistors. For example, in an exemplary embodiment, the concentration of the hydrogen included in the third gate insulation layer 132 may be greater than about 3.0 E+20 atom/cm$^3$ and lower than about 1.2 E+21 atom/cm$^3$.

When trap sites in the silicon oxide layer serving as the third gate insulation layer 132 are increased, the threshold voltage of the thin film transistor of the second plurality of thin film transistors may be changed by stresses due to the trap sites. Therefore, in an exemplary embodiment the trap sites in the third gate insulation layer 132 may be decreased so that the thin film transistor of the second plurality of thin film transistors may have a high reliability. For example, the trap sites in the third gate insulation layer 132 may be quantified by an NO$_2$ spin density. The NO$_2$ spin density may indicate the density of defects of the NO$_2$ state included in a layer. In an exemplary embodiment, the NO$_2$ spin density in the third gate insulation layer 132 may be lowered. For example, the NO$_2$ spin density in the third gate insulation layer 132 may be lower than about 1.6 E+19 spins/cm$^3$.

A third gate pattern 134 may be disposed on the third gate insulation layer 132. For example, as shown in the exemplary embodiment of FIG. 2, a lower surface of the third gate pattern 134 may directly contact an upper surface of the third gate insulation layer 132. The third gate pattern 134 may overlap the second channel region 130b of the second active pattern 130 (e.g., in a thickness direction of the base substrate 100). In an exemplary embodiment, the third gate pattern 134 may include a metal such as aluminum (Al), silver (Ag), chromium (Cr), titanium (Ti), tantalum (Ta), molybdenum (Mo), alloys thereof, nitrides thereof, conductive metal oxides, transparent conductive materials, or the like.

In an exemplary embodiment, the third gate pattern 134 may have a stacked structure including a titanium layer pattern 134a and a molybdenum layer pattern 134b. For example, as shown in the exemplary embodiment of FIG. 2, a lower surface of the molybdenum layer pattern 134b may directly contact an upper surface of the titanium layer pattern 134a. A lower surface of the titanium layer pattern 134a may directly contact an upper surface of the third gate insulation layer 132. In this embodiment, the titanium layer pattern 134a may serve as a metal barrier layer, and the molybdenum layer pattern 134b may serve as a gate electrode.

In exemplary embodiments in which the titanium layer pattern 134a is used as the metal barrier layer, the titanium layer pattern 134a may have a thickness of about 100 Å or more. For example, the thickness of the titanium layer pattern 134a may be about 100 Å to about 300 Å.

The third gate pattern 134 may overlap the second channel region 130b (e.g., in a thickness direction of the base substrate 100). Thus, the third gate pattern 134 may prevent hydrogen included in a second insulating interlayer 140 from being diffused into the second channel region 130b. In an exemplary embodiment, the molybdenum layer pattern 134b may have a thickness of about 2500 Å or more. Thus the molybdenum layer pattern 134b may prevent a diffusion of the hydrogen, and may have a low resistance. For example, the thickness of the molybdenum layer pattern 134b may be in a range of about 2500 Å to about 3000 Å.

The second active pattern 130, the third gate insulation layer 132, and the third gate pattern 134 may serve as one of the second plurality of thin film transistors.

The second insulating interlayer 140 may be disposed on the first insulating interlayer 120 and the third gate pattern 134. The second insulating interlayer 140 may cover the first insulating interlayer 120 and the third gate pattern 134. For example, as shown in the exemplary embodiment of FIG. 2, a lower surface of the second insulating interlayer 140 may directly contact an upper surface of the third gate insulation layer 132 and upper and lateral side surfaces of the third gate pattern 134. In an exemplary embodiment, the second insulating interlayer 140 may include at least one compound selected from silicon oxide, silicon nitride, silicon oxynitride, and the like. In an exemplary embodiment, the second insulating interlayer 140 may be a single layer including a single material.

A first source pattern and a first drain pattern of a first source/drain patterns 150 may contact the first source region and first drain region of the first source/drain regions 104a, respectively. The first source pattern and the first drain pattern of the first source/drain patterns 150 may pass through first contact holes that extend through the second insulating interlayer 140, the third gate insulation layer 132, the first insulating interlayer 120, the second gate insulation layer 110 and the first gate insulation layer 106. The first source/drain patterns 150 may be disposed on the second insulating interlayer 140. For example, as shown in the exemplary embodiment of FIG. 2, a lower surface of the first source/drain patterns 150 may directly contact an upper surface of the second insulating interlayer 140. The first source/drain patterns 150 may be electrically connected to the first source/drain regions 104a.

A second source pattern a second drain pattern of second source/drain patterns 152 may contact the second source region and the second drain region of the second source/drain regions 130a, respectively. The second source/drain patterns 152 may pass through second contact holes that extend through the second insulating interlayer 140 and the third gate insulation layer 132. The second source/drain patterns 152 may be disposed on the second insulating interlayer 140. For example, as shown in the exemplary embodiment of FIG. 2, a lower surface of the second source/drain patterns 152 may directly contact an upper surface of the second insulating interlayer 140. The second source/drain patterns 152 may be electrically connected to the second source/drain regions 130a.

A first insulation layer 154 may be disposed on the second insulating interlayer 140 to cover the first source/drain patterns 150 and the second source/drain patterns 152. For example, as shown in the exemplary embodiment of FIG. 2, a lower surface of the first insulation layer 154 may directly contact an upper surface of the second insulating interlayer 140 and upper and lateral side surfaces of the first source/drain patterns 150 and second source/drain patterns 152. In an exemplary embodiment, the first insulation layer 154 may include an organic insulation material such as at least one compound selected from phenol resin, acrylic resin, polyimide resin, polyamide resin, siloxane resin, epoxy resin, and the like.

A lower electrode 156 of an organic light emitting diode LE may be disposed on the first insulation layer 154. For example, as shown in the exemplary embodiment of FIG. 2, a lower surface of the lower electrode 156 may directly contact an upper surface of the first insulation layer 154. A lower portion of the lower electrode 156 may pass through a third contact hole that extends through the first insulation layer 154, and may be connected to one of the first source/drain patterns 150.

A pixel defining layer 158 may be disposed on the lower electrode 156. For example, as shown in the exemplary embodiment of FIG. 2, a lower surface of the pixel defining layer 158 may contact upper surfaces of the first insulation layer 154 and upper surfaces of lateral end portions of the lower electrode 156 and lateral sides of the lower electrode 156. The pixel defining layer 158 may have an opening exposing a portion of the lower electrode 156. For example, as shown in the exemplary embodiment of FIG. 2, the openings of the pixel defining layer 158 may expose a central portion of the lower electrode 156. In an exemplary embodiment, the pixel defining layer 158 may include an organic insulation material.

A light emitting layer 160 may be disposed on the lower electrode 156. For example, as shown in the exemplary embodiment of FIG. 2, a lower surface of the light emitting layer 160 may directly contact an upper surface of the lower electrode 156. In an exemplary embodiment, the light emitting layer 160 may include at least one of functional layers such as a hole injection layer, a hole transport layer, an organic emitting layer, an electron transport layer, and an electron injection layer. The light emitting layer 160 may be a single layer structure or multi-layer structure. The light emitting layer 160 may include a low molecular organic compound or a high molecular organic compound.

An upper electrode 162 may be disposed on the light emitting layer 160. For example, as shown in the exemplary embodiment of FIG. 2, a lower surface of the upper electrode 162 may directly contact a lower surface of the light emitting layer 160. In an exemplary embodiment, the upper electrode 162 may continuously extend on a display area (e.g., in a direction parallel to an upper surface of the base substrate 100) to cover a plurality of pixels. In an exemplary embodiment, a capping layer and a blocking layer may be further disposed on the upper electrode 162.

The lower electrode 156, the light emitting layer 160, and the upper electrode 162 may serve as an organic light emitting diode 164.

In an exemplary embodiment, an encapsulation layer 170 may be disposed on the organic light emitting diode 164. For example, as shown in the exemplary embodiment of FIG. 2, a lower surface of the encapsulation layer 170 may directly contact an upper surface of the upper electrode 162. In an exemplary embodiment, the encapsulation layer 170 may have a stacked structure including at least one inorganic layer and at least one organic layer.

As described above, the thin film transistor of the second plurality of thin film transistors may have the target threshold voltage which depend on the thickness and the properties of the second active pattern. Therefore, the thin film transistor of the second plurality of thin film transistors may stably perform switching operation, and leakage currents of the thin film transistor of the second plurality of thin film transistors may be greatly decreased.

Thus, when an image is maintained in the display device, off-leakage currents of the display device may be decreased, and power consumption of the display device may be decreased.

Figure 3:
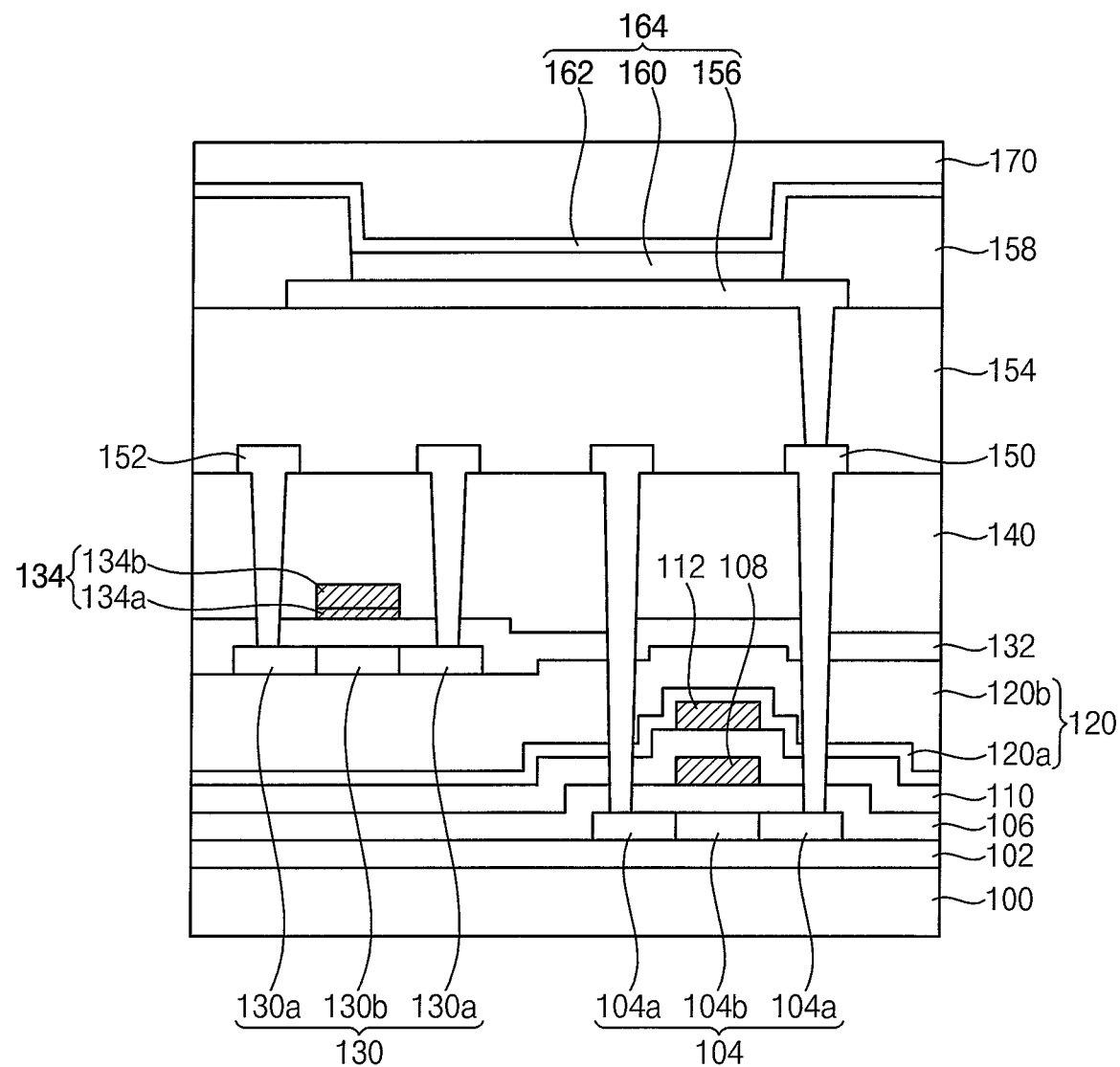
FIG. 3 is a cross-sectional view of an OLED device according to an exemplary embodiment of the present inventive concepts.

FIG. 3 is a cross-sectional view of an OLED device according to an exemplary embodiment of the inventive concept.

The OLED device shown in FIG. 3 may be substantially the same as the OLED device shown in FIG. 2, except for a first insulating interlayer 120 disposed under the second active pattern 130.

Referring to the exemplary embodiment of FIG. 3, the first insulating interlayer 120 may include a lower first insulating interlayer 120a and an upper first insulating interlayer 120b. For example, as shown in the exemplary embodiment of FIG. 3, a lower surface of the lower first insulating interlayer 120a may directly contact an upper surface and lateral side surfaces of the second gate pattern 112 and an upper surface of the second gate insulation layer 110. The lower surface of the upper first insulating interlayer 120b may directly contact an upper surface of the lower first insulating interlayer 120a. An upper surface of the upper first insulating interlayer 120b may directly contact lower surfaces of the second active pattern 130 and the third gate insulation layer 132. In an exemplary embodiment, the lower first insulating interlayer 120a may include silicon nitride. In an exemplary embodiment, the upper first insulating interlayer 120b may include silicon oxide. For example, the first insulating interlayer 120 may have a structure in which silicon nitride and silicon oxide are stacked to form the lower first insulating interlayer 120a and upper first insulating interlayer 120b, respectively.

In the etching process for forming the second gate pattern 112, fluorine ions may remain at an upper surface of the second gate insulation layer 110. The lower first insulating interlayer 120a may be a barrier layer for preventing the remaining fluorine ions from diffusing upward. For example, the lower first insulating interlayer 120a may prevent the fluorine ions from diffusing into the second active pattern 130.

When a thickness of the lower first insulating interlayer 120a is less than about 300 Å, an effect of a diffusion barrier of the fluorine ions may be reduced. When the thickness of the lower first insulating interlayer 120a is greater than about 3000 Å, a total thickness of first insulating interlayer 120 may be increased and a parasitic capacitance may be increased. Therefore, the thickness of the lower first insulating interlayer 120a (e.g., length in a thickness direction of the base substrate 100) may be greater than about 300 Å. In an exemplary embodiment, the thickness of the lower first insulating interlayer 120a may be in range of about 300 Å to about 3000 Å.

The upper first insulating interlayer 120b may contact the lower surface of the second active pattern 130, and thus the upper first insulating interlayer 120b may affect characteristics of a thin film transistor of the second plurality of thin film transistors. In an exemplary embodiment, a thickness of the upper first insulating interlayer 120b may be greater than about 50 Å. For example, the thickness of the upper first insulating interlayer 120b may be in range of about 50 Å to about 5000 Å.

When a concentration of hydrogen in the upper first insulating interlayer 120b is increased, a threshold voltage of the thin film transistor of the second plurality of thin film transistors is significantly lowered to have a negative value. Thus, in an exemplary embodiment, the concentration of the hydrogen in the upper first insulating interlayer 120b may be lowered so that the thin film transistor of the second plurality of thin film transistors may have a target threshold voltage. For example, the concentration of the hydrogen in the upper first insulating interlayer 120b may be in a range of greater than about 3.0 E+20 atom/cm$^3$ and lower than about 9.9 E+20 atom/cm$^3$.

In addition, when the number of trap sites of the upper first insulating interlayer 120b is increased, the threshold voltage of the thin film transistor of the second plurality of thin film transistors may be changed by stresses due to the trap sites. Thus, in an exemplary embodiment, the number of the trap sites of the upper first insulating interlayer 120b may be reduced to provide high reliability of the thin film transistor of the second plurality of thin film transistors. For example, the trap sites of the upper first insulating interlayer 120b may be quantified by the NO$_2$ spin density, and thus, the NO$_2$ spin density of the upper first insulating interlayer 120b may be lowered. In an exemplary embodiment, the NO$_2$ spin density of the upper first insulating interlayer 120b may be lower than about 5 E+16 spins/cm$^3$. However, exemplary embodiments of the present inventive concepts are not limited thereto.

Further, in an exemplary embodiment, the upper first insulating interlayer 120b may have a reduced water adhesion.

As described above, the threshold voltage of the thin film transistor of the second plurality of thin film transistors may be changed by the stacked structure of the first insulating interlayer 120, and thus the thin film transistor of the second plurality of thin film transistors may have the target threshold voltage. Therefore, the thin film transistor of the second plurality of thin film transistors may stably perform a switching operation, and leakage currents of the thin film transistor of the second plurality of thin film transistors may be greatly decreased.

In the description with reference to the exemplary embodiment of FIG. 2, the second active pattern 130 may include indium-gallium-zinc oxide (IGZO). However, the materials of the second active pattern 130 are not be limited thereto. For example, in an exemplary embodiment, the second active pattern 130 may include a compound selected from indium tin-zinc oxide (ITZO), gallium zinc oxide (GaZnxOy), indium zinc oxide (IZO), zinc magnesium oxide (ZnMgxOy), zinc tin Oxide (ZnSnxOy), Zinc Zirconium Oxide (ZnZrxOy), Zinc Oxide (ZnOx), Gallium Oxide (GaOx), Tin Oxide (SnOx), Indium Oxide (InOx), Indium Gallium Hafnium Oxide (IGHO), Tin-aluminum-zinc oxide (TAZO), indium-gallium-tin oxide (IGSO), and the like. These compounds may be used alone or in combination thereof. In an exemplary embodiment, the semiconductor oxide described above may be doped with at least one compound selected from lithium (Li), sodium (Na), manganese (Mn), nickel (Ni), palladium (Pd), copper (Cu), carbon (C), nitrogen (N), Phosphorus (P), titanium (Ti), zirconium (Zr), vanadium (V), ruthenium (Ru), germanium (Ge), tin (Sn), fluorine (F), etc.

Figure 4:
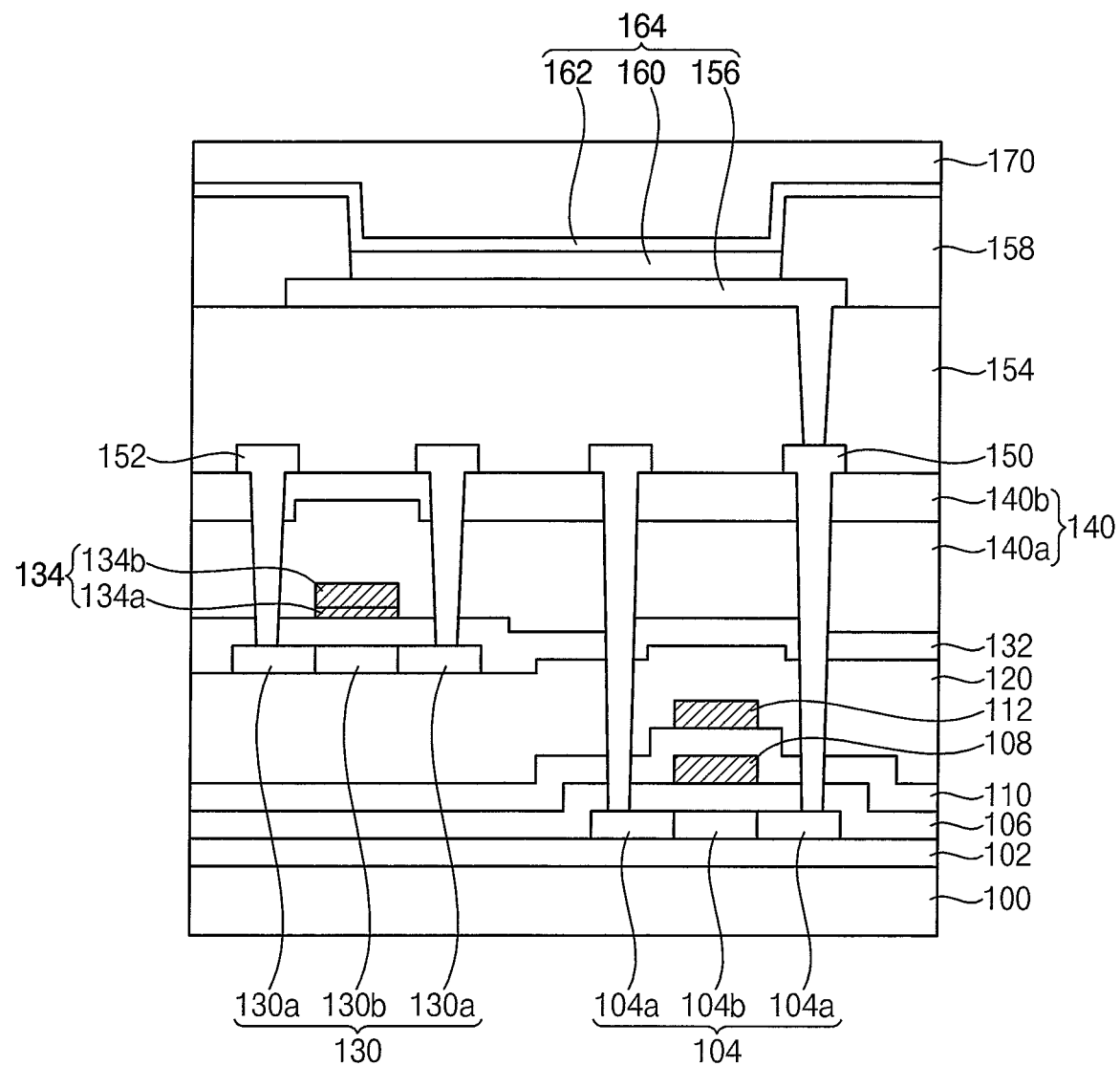
FIG. 4 is a cross-sectional view of an OLED device according to an exemplary embodiment of the present inventive concepts.

FIG. 4 is a cross-sectional view of an OLED device according to an exemplary embodiment of the present inventive concepts.

The OLED device shown in the exemplary embodiment of FIG. 4 may be substantially the same as the OLED device shown in FIG. 2, except for a second insulating interlayer disposed on the third gate pattern.

Referring to the exemplary embodiment of FIG. 4, the second insulating interlayer 140 may include a lower second insulating interlayer 140a and an upper second insulating interlayer 140b. For example, as shown in the exemplary embodiment of FIG. 4, a lower surface of the lower second insulating interlayer 140a may directly contact an upper surface and lateral side surfaces of the third gate pattern 134 and an upper surface of the third gate insulation layer 132. The lower surface of the upper second insulating interlayer 140b may directly contact an upper surface of the lower second insulating interlayer 140a. An upper surface of the upper second insulating interlayer 140b may directly contact lower surfaces of the first insulation layer 154, the first source/drain patterns 150 and the second source/drain patterns 152. In an exemplary embodiment, the lower second insulating interlayer 140a may include silicon oxide. The upper second insulating interlayer 140b may include silicon nitride. The second insulating interlayer 140 may have a structure in which the silicon oxide and the silicon nitride are stacked to form the lower second insulating interlayer 140a and upper second insulating interlayer 140b, respectively.

Since the lower second insulating interlayer 140a includes the silicon oxide having a dielectric constant lower than a dielectric constant of the silicon nitride, a parasitic capacitance due to the second insulating interlayer 140 may be decreased. In an exemplary embodiment, the lower second insulating interlayer 140a may have a thickness of about 500 Å or more. For example, the thickness of the lower second insulating interlayer 140a may be about 500 Å to about 5000 Å.

The silicon nitride in the upper second insulating interlayer 140b may include hydrogen therein. The hydrogen may be diffused into the source/drain regions 130a of the second active pattern 130, and thus resistances of the source/drain regions may be decreased by the diffused hydrogen. Therefore, on-state currents of the thin film transistor of the second plurality of thin film transistors may be increased. Since the third gate pattern 134 is formed, the hydrogen may hardly diffuse in the third gate insulation layer 132 disposed under the third gate pattern 134. Thus, a concentration of the hydrogen in the third gate insulation layer 132 may not be changed.

When a thickness of the upper second insulating interlayer 140b is relatively thin, the hydrogen may not be sufficiently diffused into the source/drain regions 130a. Therefore, in an exemplary embodiment, the upper second insulating interlayer 140b may have a thickness of about 1000 Å or more. When the thickness of the upper second insulating interlayer 140b is increased, the parasitic capacitance due to the upper second insulating interlayer 140b may be increased. Therefore, in an exemplary embodiment, the thickness of the upper second insulating interlayer 140b may be about 1000 Å to about 5000 Å. In FIG. 4, the thickness of the lower second insulating interlayer 140a is greater than the thickness of the upper second insulating interlayer 140b. However, exemplary embodiments of the present inventive concepts are not limited thereto.

Further, in an exemplary embodiment, the concentration of the hydrogen in the upper second insulating interlayer 140b may be in a range of about 1.19 E+22 atom/cm$^3$ to about 1.28 E+22 atom/cm$^3$.

As described above, a threshold voltage of the thin film transistor of the second plurality of thin film transistors may be changed by the stacked structure of the second insulating interlayer 140, and thus the thin film transistor of the second plurality of thin film transistors may have a target threshold voltage. Therefore, the thin film transistor of the second plurality of thin film transistors may stably perform a switching operation, and leakage currents of the thin film transistor of the second plurality of thin film transistors may be greatly decreased.

Figure 5:
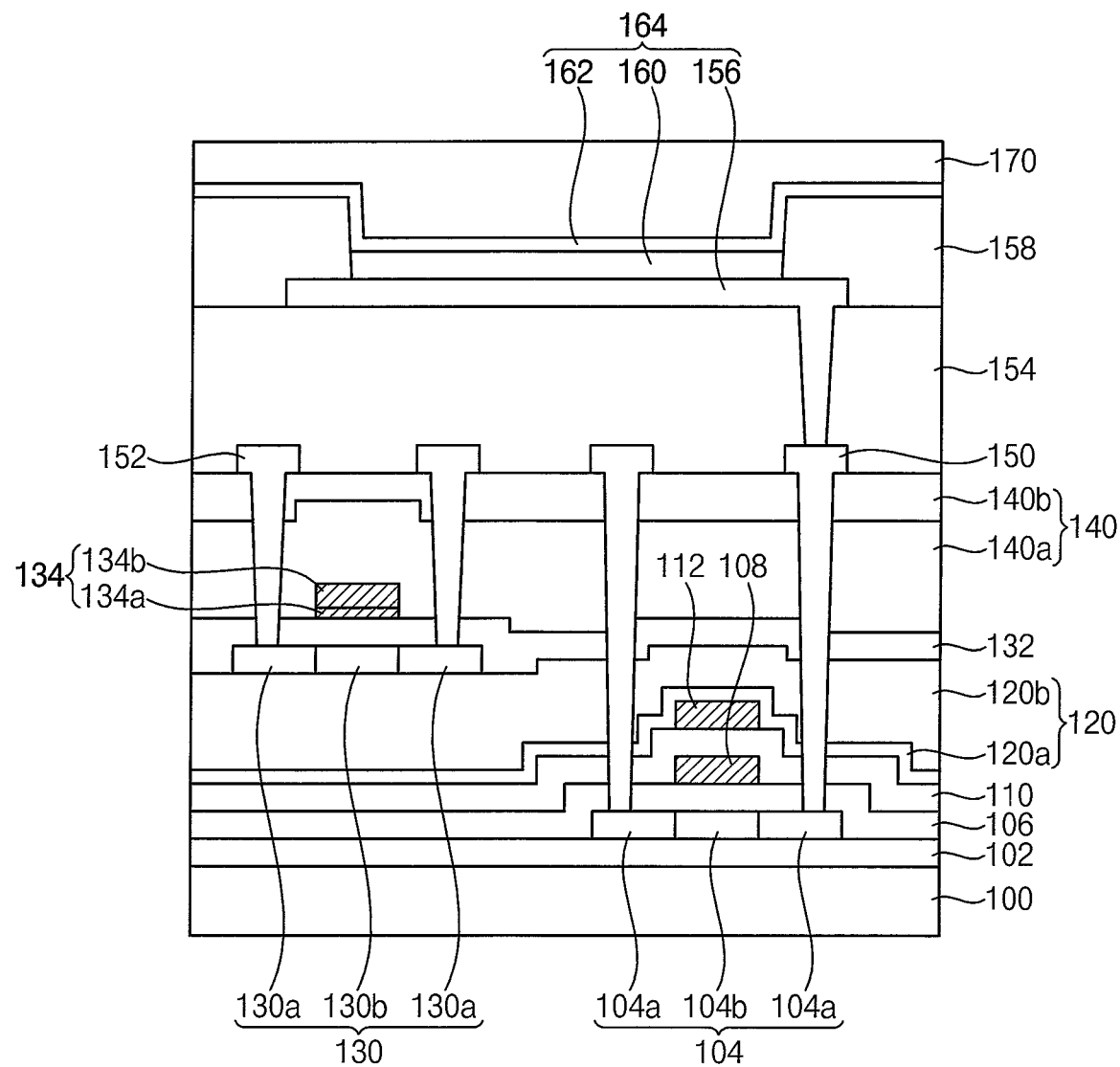
FIG. 5 is a cross-sectional view of an OLED device according to an exemplary embodiment of the present inventive concepts.

FIG. 5 is a cross-sectional view of an OLED device according to an exemplary embodiment of the present inventive concepts.

The OLED device shown in the exemplary embodiment of FIG. 5 may be substantially the same as the OLED device shown in the exemplary embodiment of FIG. 2, except for a first insulating interlayer and a second insulating interlayer.

Referring to the exemplary embodiment of FIG. 5, the first insulating interlayer 120 may include a lower first insulating interlayer 120a and an upper first insulating interlayer 120b. In an exemplary embodiment, the lower first insulating interlayer 120a may include silicon nitride.

In an exemplary embodiment, the upper first insulating interlayer 120b may include silicon oxide. Therefore, the first insulating interlayer 120 may have a structure in which the silicon nitride and the silicon oxide are stacked.

The lower first insulating interlayer 120a and the upper first insulating interlayer 120b may be substantially the same as the lower first insulating interlayer 120a and the upper first insulating interlayer 120b illustrated with reference to the exemplary embodiment of FIG. 3, respectively.

The second insulating interlayer 140 may include a lower second insulating interlayer 140a and an upper second insulating interlayer 140b. In an exemplary embodiment, the lower second insulating interlayer 140a may include silicon oxide. In an exemplary embodiment, the upper second insulating interlayer 140b may include silicon nitride. Therefore, the second insulating interlayer 140 may have a structure in which the silicon oxide and the silicon nitride are stacked to form the lower second insulating interlayer 140a and the upper second insulating interlayer 140b, respectively.

The lower second insulating interlayer 140a and the upper second insulating interlayer 140b may be the same as the lower second insulating interlayer 140a and the upper second insulating interlayer 140b illustrated with reference to the exemplary embodiment of FIG. 4, respectively.

As described above, the second active pattern 130, the first insulating interlayer 120, and the second insulating interlayer 140 may be configured so that the thin film transistor of the second plurality of thin film transistors may have the target threshold voltage. Therefore, the thin film transistor of the second plurality of thin film transistors may stably perform a switching operation, and leakage currents of the second thin film transistor may be greatly decreased.

FIGS. 6 to 16 are cross-sectional views illustrating a method of manufacturing an OLED device according to exemplary embodiments of the present inventive concepts.

Figure 6:
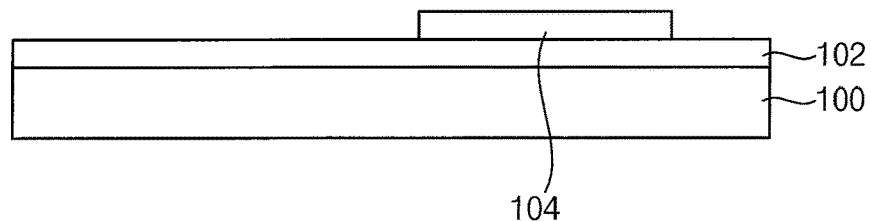
FIGS. 6 to 16 are cross-sectional views illustrating a method of manufacturing an OLED device according to exemplary embodiments of the present inventive concepts.

Referring to the exemplary embodiment of FIG. 6, a buffer layer 102 may be formed on a base substrate 100. The buffer layer 102 may prevent a penetration of contaminants, such as particles, moisture, or outside air from the base substrate 100. As shown in the exemplary embodiment of FIG. 6, the buffer layer 102 may have a substantially flat top surface.

A first active pattern 104 may be formed on the buffer layer 102.

In an exemplary embodiment, the first active pattern 104 may be formed by forming an amorphous silicon layer. The amorphous silicon layer may be crystallized to form a polysilicon layer. The polysilicon layer may be patterned by photolithography process to form the first active pattern 104.

For example, in an exemplary embodiment, the amorphous silicon layer may be formed by a low-pressure chemical vapor deposition (LPCVD), a plasma-enhanced chemical vapor deposition (PECVD), or the like. However, exemplary embodiment of the present inventive concepts are not limited thereto. In an exemplary embodiment, the amorphous silicon layer may be crystallized by an excimer laser annealing, a sequential lateral solidification, or the like.

Figure 7:
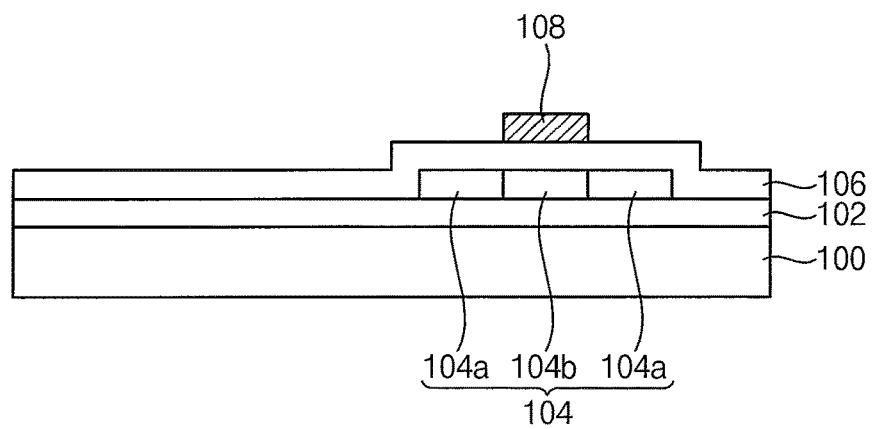

Referring to the exemplary embodiment of FIG. 7, a first gate insulation layer 106 may be formed to cover the buffer layer 102 and the first active pattern 104. A first gate layer may be formed on the first gate insulation layer 106, and the first gate layer may be patterned to form a first gate pattern 108.

Impurities may be doped into a portion of the first active pattern 104 that does not overlap the first gate pattern 108 (e.g., in a thickness direction of the base substrate 100). Thus, a first source region and a first drain region of the first source/drain regions 104*a* which are doped with the impurities may be formed at the first active pattern 104. For example, the impurities may be P-type impurities such as boron. The portion of the first active pattern 104 overlapping with the first gate pattern 108 may serve as a first channel region 104*b*.

Figure 8:
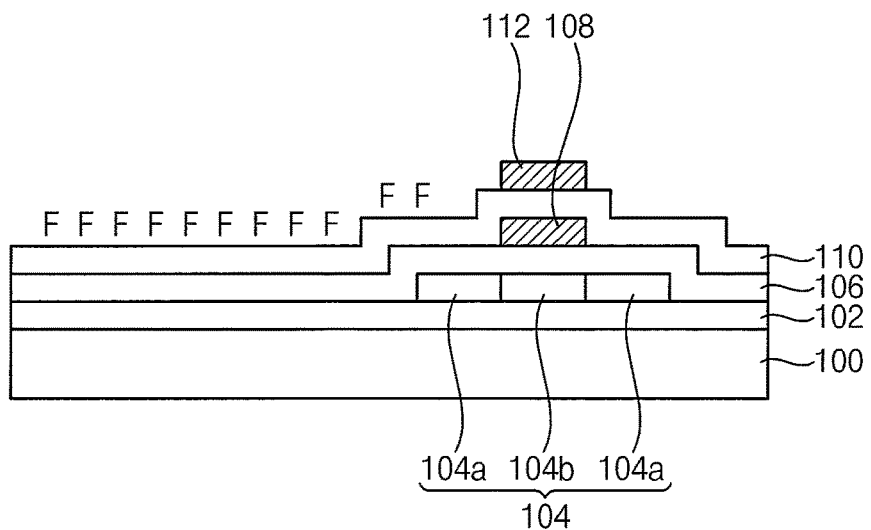

By the above process shown in the exemplary embodiments of FIGS. 6-8, a first thin film transistor including the first active pattern 104, the first gate insulation layer 106, and the first gate pattern 108 may be formed.

Referring to the exemplary embodiment of FIG. 8, a second gate insulation layer 110 may be formed on the first gate insulation layer 106 and the first gate pattern 108. A second gate layer may be formed on the second gate insulation layer 110, and the second gate layer may be patterned to form a second gate pattern 112. The second gate pattern 112 may overlap the first gate pattern 108 and the first channel region 104*b* of the first active pattern 104 (e.g., in a thickness direction of the base substrate 100).

In an exemplary embodiment, the second gate layer may include a metal layer formed by a physical vapor deposition process. A photoresist pattern may be formed on the metal layer, and the metal layer may be etched to expose the second gate insulation layer 110 using the photoresist pattern as an etching mask to form the second gate pattern 112. The photoresist pattern may be a negative photoresist pattern or a positive photoresist pattern. However, exemplary embodiments of the present inventive concepts are not limited thereto.

In an exemplary embodiment, the metal layer may be etched using plasma of an etching gas including a fluorine-based compound. For example, the fluorine-based compound may include $SiF_4$, $CF_4$, $C_3F_8$, $C_2F_6$, $CHF_3$, $SF_6$, or a combination thereof. However, exemplary embodiments of the present inventive concepts are not limited thereto.

During the etching process of the metal layer, fluorine ions generated from the etching gas may remain at an upper surface of the second gate insulation layer 110. Also, the fluorine ions may be combined with an insulation material, such as a silicon nitride of the second gate insulation layer 110.

In subsequent processes, the fluorine ions may be diffused into the first insulating interlayer and the second active pattern disposed on the second gate insulation layer 110. In instances in which the fluorine ion is diffused into the second active pattern, a threshold voltage of a thin film transistor of the second plurality of thin film transistors may be lowered and electrical characteristics of the thin film transistor of the second plurality of thin film transistors may be lowered. Therefore, in an exemplary embodiment, the first insulating interlayer 120 disposed on the second gate insulation layer 110 may have a structure which provides a diffusion barrier of the fluorine ions to maintain the threshold voltage of the thin film transistor of the second plurality of thin film transistors.

As the second gate pattern 112 is formed, a capacitor including the first gate pattern 108, the second gate insulation layer 110 and the second gate pattern 112 may be formed.

Figure 9:
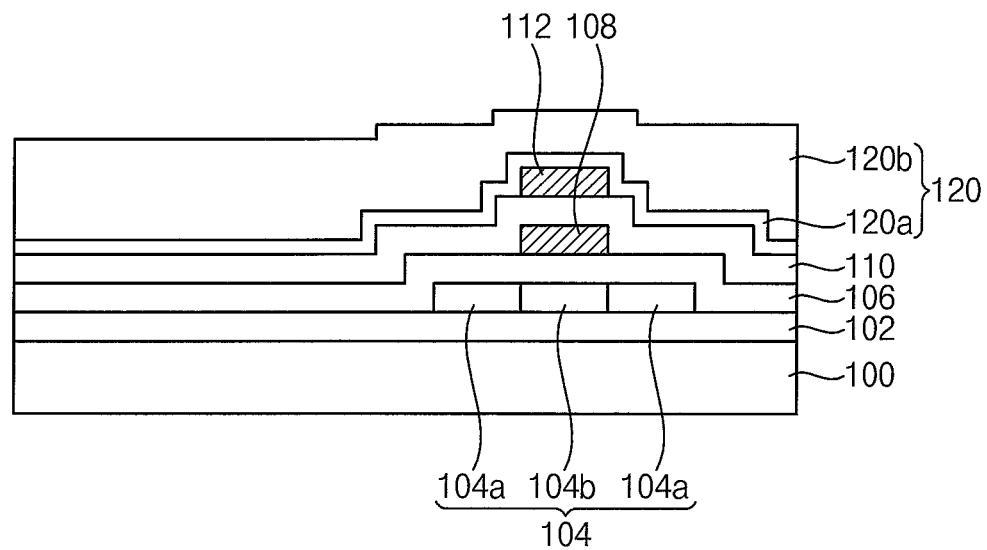

Referring to the exemplary embodiment of FIG. 9, a first insulating interlayer 120 may be formed on the second gate insulation layer 110 and the second gate pattern 112.

As shown in the exemplary embodiment of FIG. 9, the first insulating interlayer 120 may include a lower first insulating interlayer 120*a* and an upper first insulating interlayer 120*b*. However, exemplary embodiments of the present inventive concepts are not limited thereto. In an exemplary embodiment, the lower first insulating interlayer 120*a* may include silicon nitride. In an exemplary embodiment, the upper first insulating interlayer 120*b* may include silicon oxide.

The lower first insulating interlayer 120*a* and the upper first insulating interlayer 120*b* may be formed to have the characteristics of the lower first insulating interlayer and the upper first insulating interlayer described with reference to the exemplary embodiment of FIG. 3, respectively.

In an exemplary embodiment, the lower first insulating interlayer 120*a* and the upper first insulating interlayer 120*b* may be formed by a chemical vapor deposition process.

Figure 10:
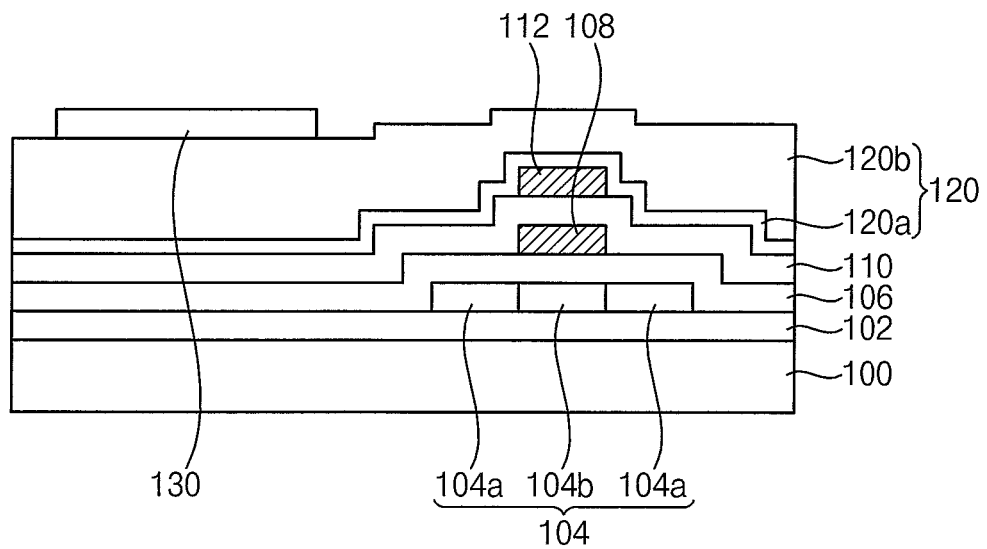

In an exemplary embodiment, the deposition gases used in the deposition process for forming the lower first insulating interlayer 120*a* may include silicon source gas and nitrogen source gas. In an exemplary embodiment, the lower first insulating interlayer 120*a* may have a thickness in a range of about 300 Å3 to about 3000 Å, so that the lower first insulating interlayer 120*a* may prevent upward diffusion of the fluorine ions formed in the second gate insulation layer 110 to the second active pattern 130 (FIG. 10). In this embodiment, it may not be necessary to provide a specific concentration of hydrogen in the lower first insulating interlayer 120*a* because the concentration of hydrogen in the lower first insulating interlayer 120*a* may not significantly affect the diffusion barrier effect of the lower first insulating interlayer 120*a*.

In an exemplary embodiment, deposition gases including silicon source gas and oxygen source gas may be used in the deposition process of forming the upper first insulating interlayer 120*b* that is formed on the lower first insulating interlayer 120*a*. In an exemplary embodiment, the silicon source gas may include hydrogen. For example, process conditions such as a flow rate of the silicon source gas and a power during the deposition process may be controlled, so that the concentration of the hydrogen in the silicon oxide may be controlled. For example, the silicon source gas may include $SiH_4$, $SiH_2Cl_2$, $Si_2H_6$, or the like. However, exemplary embodiments of the present inventive concepts are not limited thereto.

In another exemplary embodiment, the first insulating interlayer 120 may be formed of a single layer including one compound selected from silicon oxide, silicon nitride, and silicon oxynitride. In this embodiment, the OLED device shown in the exemplary embodiments of FIG. 2 or 4 may be manufactured by performing subsequent processes.

Referring to the exemplary embodiment of FIG. 10, a second active pattern 130 may be formed on the first insulating interlayer 120. In an exemplary embodiment, a second active layer may be formed on the first insulating interlayer 120 and the second active layer may be patterned by a photolithography process to form the second active pattern 130.

In an exemplary embodiment, the second active layer may be formed by a physical vapor deposition process, such as a sputtering process, etc.

In an exemplary embodiment, the second active layer may be formed of indium-gallium-zinc oxide (IGZO). In this embodiment, the second active layer may have characteristics substantially the same as characteristics of the second active pattern illustrated with reference to the exemplary embodiment of FIG. 2. For example, a thickness of the second active layer may be in a range of about 150 Å to about 400 Å. A density of the second active layer may be greater than about 6.3 g/cm$^3$ and lower than about 6.63 g/cm$^3$. A refractive index of the second active layer may be in a range of about 1.92 to about 1.93, when measured at a wavelength of 632 nm.

The density and the refractive index of the second active layer may be controlled by process conditions of forming the second active layer. For example, in the deposition process of the second active layer, the density and the refractive index of the second active layer may be controlled by adjusting a partial pressure of oxygen.

When the partial pressure of the oxygen is increased in the deposition process, the number of oxygen components (e.g., a concentration of oxygen) in the second active layer may increase, and thus a threshold voltage of a thin film transistor of the second plurality of thin film transistors may increase. When the partial pressure of the oxygen is decreased in the deposition process, the oxygen components in the second active layer may decreased, and thus the threshold voltage of the thin film transistor of the second plurality of thin film transistors may be lowered. In an exemplary embodiment, the partial pressure of the oxygen used in the deposition process for forming the second active layer may be about 20% to about 80% to maintain the target threshold voltage for the thin film transistor of the second plurality of thin film transistors.

In an exemplary embodiment, in the deposition process of the second active layer, a target material of the indium-gallium-zinc 1:1:1 may be used. In an exemplary embodiment, the deposition process of the second active layer may be performed at a power of about 40 KW to about 60 KW, a pressure of about 0.3 Pa to about 0.5 Pa, and a temperature of about 10° C. to about 200° C. However, exemplary embodiments of the present inventive concepts are not limited thereto and process conditions of the deposition process vary.

Figure 11:
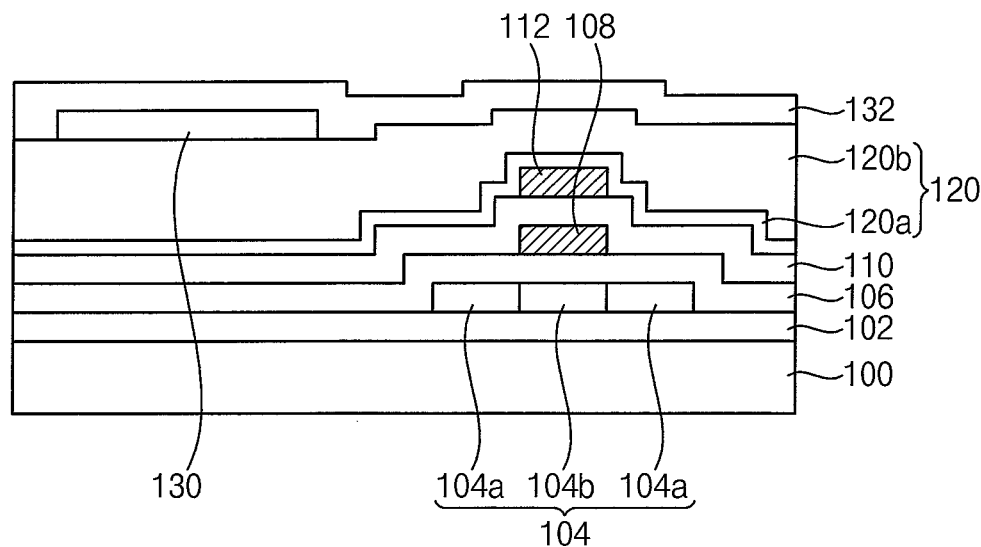

Referring to the exemplary embodiment of FIG. 11, a third gate insulation layer 132 may be formed on the first insulating interlayer 120 and the second active pattern 130.

In an exemplary embodiment, the third gate insulation layer 132 may include at least one compound selected from silicon oxide, silicon nitride, silicon oxynitride, and the like. The third gate insulation layer 132 may be formed by a chemical vapor deposition process. However, exemplary embodiments of the present inventive concepts are not limited thereto.

In an exemplary embodiment, the third gate insulation layer 132 may have characteristics substantially the same as characteristics of the third gate insulation layer 132 illustrated with reference to the exemplary embodiment of FIG. 2. For example, the third gate insulation layer 132 may be formed of silicon oxide, and a concentration of the hydrogen in the third gate insulation layer 132 may be greater than about 3.0 E+20 atom/cm$^3$ and lower than about 1.2 E+21 atom/cm$^3$. Further, the NO$_2$ spin density of the third gate insulation layer 132 may be lower than about 1.6 E+19 spins/cm$^3$.

In an exemplary embodiment, the deposition gases used in the deposition process for forming the third gate insulation layer 132 may include a silicon source gas and an oxygen source gas. The oxygen source gas may include hydrogen. Therefore, process conditions such as a flow rate of the silicon source gas and a power during the deposition process may be controlled, so that the concentration of the hydrogen in the silicon oxide may be controlled.

Figure 12:
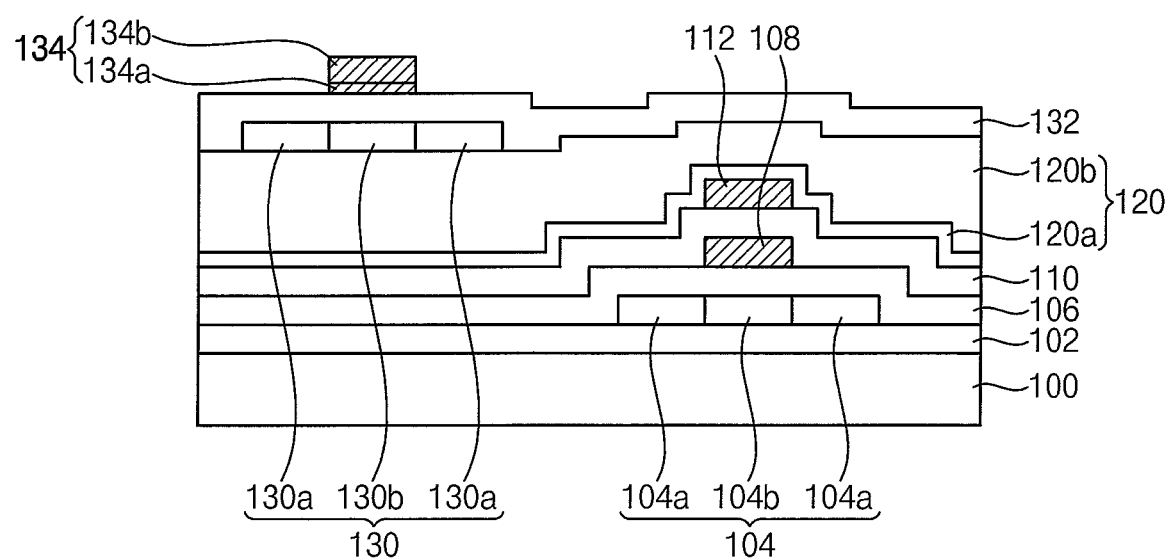

Referring to the exemplary embodiment of FIG. 12, a third gate layer may be formed on the third gate insulation layer 132, and the third gate layer may be patterned to form the third gate pattern 134.

For example, in an exemplary embodiment, the third gate layer may include a metal layer formed by a physical vapor deposition process. A photoresist pattern may be formed on the metal layer, and the metal layer may be etched to expose the third gate insulation layer using the photoresist pattern as an etching mask to form the third gate pattern 134.

In an exemplary embodiment, the third gate pattern 134 may include a structure in which a titanium layer pattern 134*a* and a molybdenum layer pattern 134*b* are stacked. In this embodiment, a titanium layer and a molybdenum layer may be sequentially formed on the third gate insulation layer 132. For example, as shown in the exemplary embodiment of FIG. 12, the molybdenum layer pattern 134*b* may be stacked on an upper surface of the titanium layer pattern 134*a*. The titanium layer and the molybdenum layer may serve as a third gate layer. In an exemplary embodiment, the titanium layer may be formed to have a thickness of about 100 Å or more. For example, the thickness of the titanium layer may be in a range of about 100 Å to about 300 Å. The molybdenum layer may be formed to have a thickness of about 2500 Å or more. For example, the thickness of the molybdenum may be in a range of about 2500 Å to about 3000 Å, for preventing from a diffusion of the hydrogen and having a low resistance. However, exemplary embodiments of the present inventive concepts are not limited thereto and the stacked structure of the third gate pattern 134 may vary in other exemplary embodiments.

A portion of the second active pattern 130 overlapping (e.g., in a thickness direction of the base substrate 100) with third gate pattern 134 may serve as a second channel region 130*b*. In the second active pattern 130, a portion that does not overlap with the third gate pattern 134 may be second source/drain regions 130*a*. For example, the second source/drain regions 130*a* may be spaced apart from each other in a direction parallel to an upper surface of the base substrate 100 with the second channel region 130*b* disposed therebetween.

Figure 13:
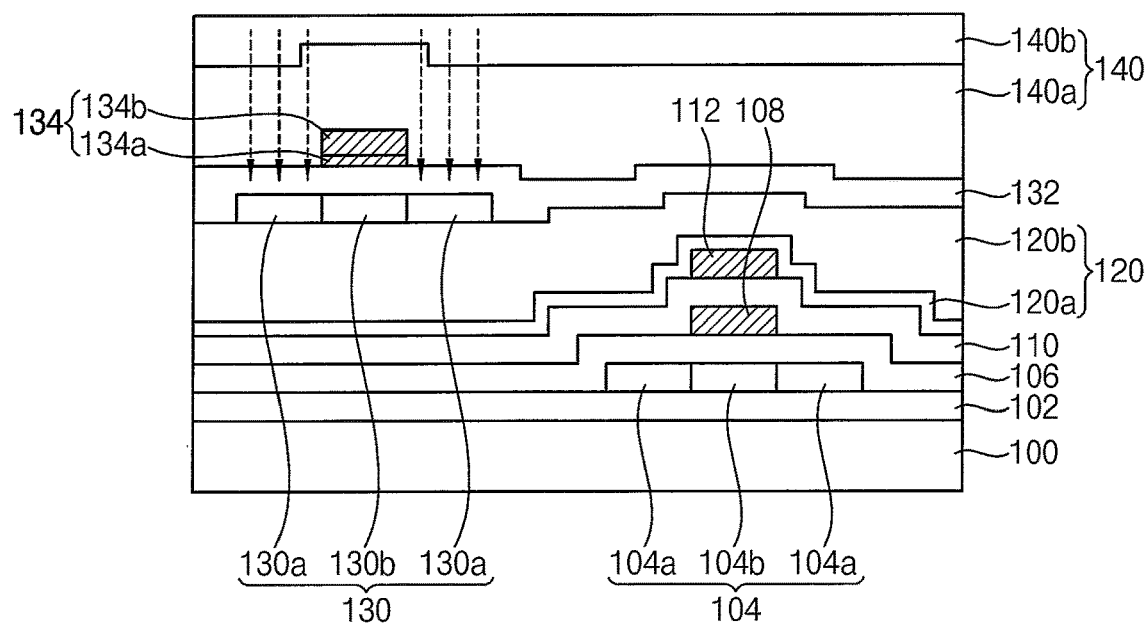

Referring to the exemplary embodiment of FIG. 13, a second insulating interlayer 140 may be formed to cover the third gate insulation layer 132 and the third gate pattern 134.

As shown in the exemplary embodiment of FIG. 13, the second insulating interlayer 140 may include a lower second insulating interlayer 140*a* and an upper second insulating interlayer 140*b*. In an exemplary embodiment, the lower second insulating interlayer 140*a* may include silicon oxide. In an exemplary embodiment, the upper second insulating interlayer 140*b* may include silicon nitride. In an exemplary embodiment, the lower second insulating interlayer 140*a* and the upper second insulating interlayer 140b may be formed by a chemical vapor deposition process. The lower second insulating interlayer 140a and the upper second insulating interlayer 140b may be formed to have characteristics that are the same as the characteristics of the lower second insulating interlayer 140a and the upper second insulating interlayer 140b illustrated with reference to the exemplary embodiment of FIG. 5, respectively.

In an exemplary embodiment, the lower second insulating interlayer 140a may be formed to have a thickness of about 500 Å or more. For example, the lower second insulating interlayer 140a may have a thickness in a range of about 500 Å to about 5000 Å.

In an exemplary embodiment, deposition gases including a silicon source gas and nitrogen source gas may be used in the deposition process for forming the upper second insulating interlayer 140b. In this exemplary embodiment, each of the silicon source gas and the nitrogen source gas may include the hydrogen. For example, the silicon source gas may include SiH4, SiH2Cl2, Si2H6, etc., and the nitrogen source gas may include NH3. Therefore, process conditions such as flow rates of the silicon source gas and the nitrogen source gas during the deposition process may be controlled, so that the concentration of the hydrogen in the upper second insulating interlayer 140b may be controlled.

The hydrogen in the upper second insulating interlayer 140b may be diffused to the second source/drain regions 130a of the second active pattern 130, so that a resistance of the second source/drain regions 130a may be decreased. Therefore, the on-state currents of the thin film transistor of the second plurality of thin film transistors may be increased. The hydrogen may hardly diffuse into the third gate insulation layer 132 and the second channel region 130b that overlap and are disposed under the third gate pattern 134 due to the third gate pattern 134 (e.g., the molybdenum layer pattern 134b). Therefore, a concentration of the hydrogen in the third gate insulation layer 132 under the third gate pattern 134 may not be changed.

In another exemplary embodiment, the second insulating interlayer 140 may be formed of a single layer including one compound selected from silicon oxide, silicon nitride, and silicon oxynitride. In this exemplary embodiment, the OLED device illustrated in the exemplary embodiments of FIG. 2 or 3 may be manufactured by subsequent processes.

Figure 14:
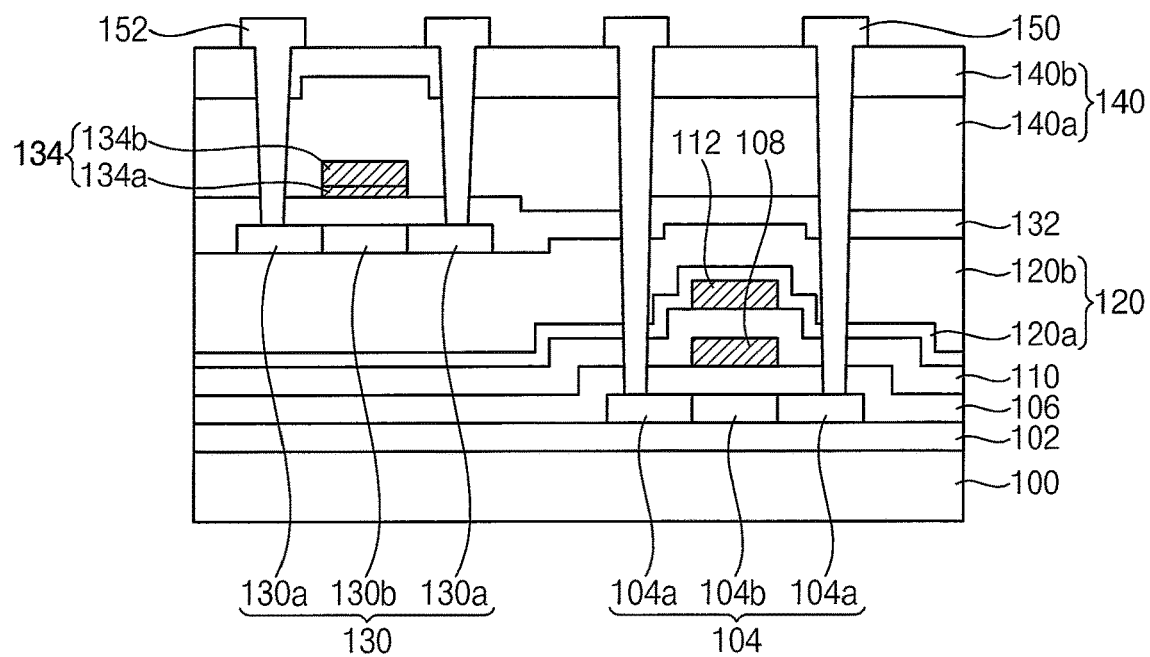

Referring to the exemplary embodiment of FIG. 14, the second insulating interlayer 140, the third gate insulation layer 132, the first insulating interlayer 120, the second gate insulation layer 110 and the first gate insulation layer 106 may be etched to form first contact holes exposing the first source/drain regions 104a.

Further, the second insulating interlayer 140 and the third gate insulation layer 132 may be etched to form second contact holes exposing the second source/drain regions 130a.

In an exemplary embodiment, a metal layer may be formed on the second insulating interlayer 140 to fill the first and second contact holes. The metal layer may be patterned to form first source/drain patterns 150 electrically connected to the first source/drain regions 104a and second source/drain patterns 152 electrically connected to the second source/drain regions 130a.

Figure 15:
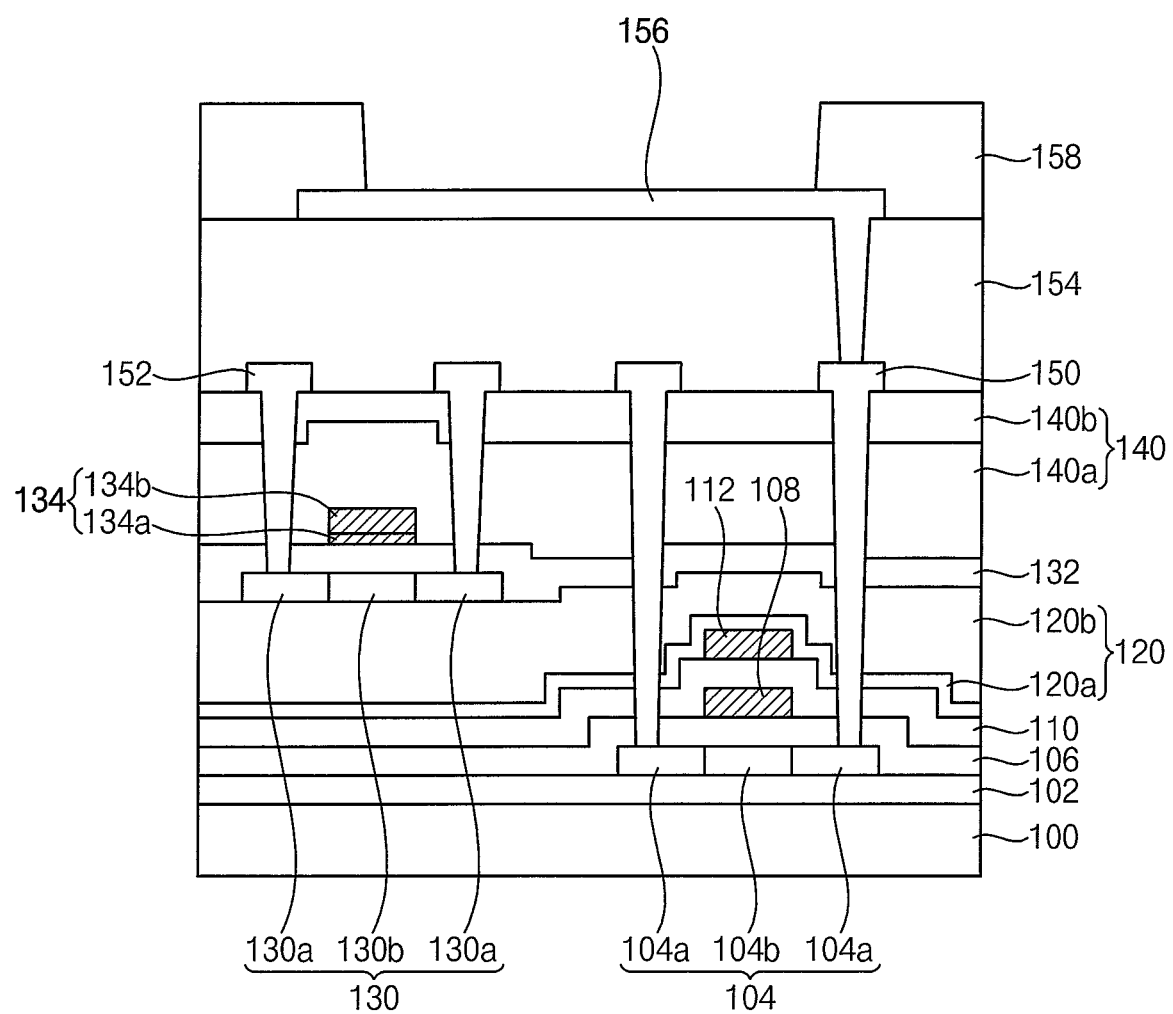

Referring to the exemplary embodiment of FIG. 15, a first insulation layer 154 may be formed to cover the second insulating interlayer 140, the first source/drain patterns 150 and the second source/drain patterns 152.

In an exemplary embodiment, a photolithography process may be performed on the first insulation layer 154 to form third contact holes exposing the first source/drain patterns 150. A lower electrode layer may be formed on the first insulation layer 154 to fill the third contact holes, and the lower electrode layer may be patterned to form a lower electrode 156 of an organic light emitting diode 200.

In an exemplary embodiment, the lower electrode 156 may operate as an anode. For example, the lower electrode 156 may serve as one of a transparent electrode and a reflection electrode, according to a light emission type. In exemplary embodiments in which the lower electrode 156 is formed as a transparent electrode, the lower electrode 156 may include at least one compound selected from indium tin oxide, indium zinc oxide, zinc tin oxide, indium oxide, zinc oxide, tin oxide, and the like. In exemplary embodiments in which the lower electrode 156 is formed as a reflection electrode, the lower electrode 156 may include at least one compound selected from gold (Au), silver (Ag), aluminum (Al), copper (Cu), nickel (Ni) platinum (Pt), magnesium (Mg), chromium (Cr), tungsten (W), molybdenum (Mo), titanium (Ti), and the like. However, exemplary embodiments of the present inventive concepts are not limited thereto. In some exemplary embodiment, the lower electrode 156 may have a stacked structure including the material used for the reflection electrode and the material used for the transparent electrode.

As shown in the exemplary embodiment of FIG. 15, a pixel defining layer 158 may be formed on the first insulation layer 154. The pixel defining layer 158 may include an opening exposing a portion of the lower electrode 156. For example, the pixel defining layer 158 may include an organic insulation material.

Figure 16:
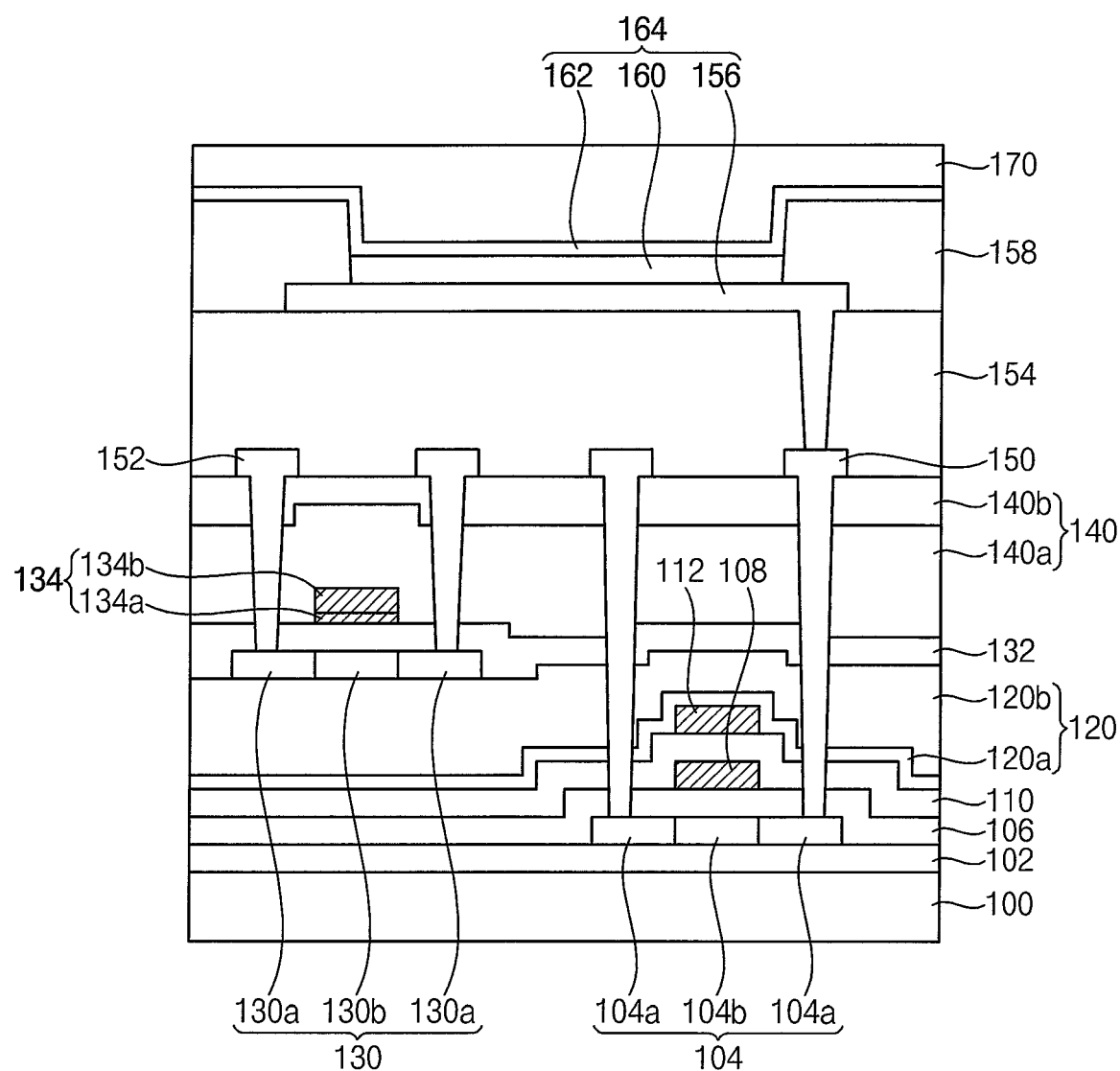

Referring to the exemplary embodiment of FIG. 16, a light emitting layer 160 may be formed on the lower electrode 156. For example, the light emitting layer 160 may be formed by a screen printing, an inkjet printing, a deposition, or the like. However, exemplary embodiments of the present inventive concepts are not limited thereto.

An upper electrode 162 may be formed on the light emitting layer 160. In an exemplary embodiment, the upper electrode 162 may be formed in common and may extend to a plurality of pixels. The upper electrode 162 may serve as one of a transparent electrode and a reflection electrode, according to a light emission type of the OLED device including the thin film transistor substrate.

Thus, an organic light emitting diode 164 including the lower electrode 156, the light emitting layer 160, and the upper electrode 162 may be formed.

An encapsulation layer 170 may be formed on the organic light emitting diode 164. The encapsulation layer 170 may have a stacked structure including at least one inorganic layer and at least one organic layer. For example, in an exemplary embodiment, the organic layer may include a cured polymer such as polyacrylate. For example, the cured polymer may be formed by a crosslinking reaction of monomers. In an exemplary embodiment, the inorganic layer may include at least one compound selected from silicon oxide, silicon nitride, silicon carbide, aluminum oxide, tantalum oxide, hafnium oxide, zirconium oxide, titanium oxide, and the like. However, exemplary embodiments of the present inventive concepts are not limited thereto.

Exemplary embodiments of present inventive concepts may be incorporated into various display devices having organic light emitting display devices. For example, exemplary embodiments of the present inventive concept may be incorporated into large, medium or small sized display devices, including display devices for vehicles, ships and aircraft, portable communication devices, display devices for exhibition or information transmission, medical display devices, home appliance display devices, or the like.

The foregoing is illustrative of exemplary embodiments of the present inventive concepts and is not to be construed as limiting thereof. Although a few exemplary embodiments of the present inventive concepts have been described, those skilled in the art will readily appreciate that many modifications are possible in the exemplary embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of exemplary embodiments of the present inventive concepts and is not to be construed as limited to the specific exemplary embodiments disclosed, and that modifications to the disclosed exemplary embodiments, as well as other exemplary embodiments, are intended to be included within the scope of the appended claims. The present inventive concepts are defined by the following claims, with equivalents of the claims to be included therein.

What is claimed is:

1. A display device, comprising:
a first thin film transistor disposed on a substrate;
a first insulating interlayer covering the first thin film transistor;
an active pattern disposed on the first insulating interlayer, the active pattern including indium-gallium-zinc oxide (IGZO) having a thickness in a range of about 150 Å to about 400 Å;
a gate insulation layer covering the active pattern;
a gate pattern disposed on the gate insulation layer; and
a second insulating interlayer covering the gate pattern,
wherein a concentration of hydrogen in the gate insulation layer is greater than about 3.0 E+20 atoms/cm$^3$ and lower than about 1.2 E+21 atoms/cm$^3$.

2. The display device of claim 1, wherein a refractive index of the active pattern is in a range of about 1.92 to about 1.93 at a wavelength of 632 nm.

3. The display device of claim 1, wherein a density of the active pattern is greater than about 6.3 g/cm$^3$ and lower than about 6.6 g/cm$^3$.

4. The display device of claim 1, wherein an NO$_2$ spin density of the gate insulation layer is lower than about 1.6 E+19 spins/cm$^3$.

5. The display device of claim 1, wherein the first insulating interlayer includes a lower first insulating interlayer including silicon nitride and an upper first insulating interlayer including silicon oxide.

6. The display device of claim 5, wherein:
a thickness of the lower first insulating interlayer is in a range of about 300 Å to about 3,000 Å; and
a thickness of the upper first insulating interlayer is in a range of about 50 Å to about 5,000 Å.

7. The display device of claim 5, wherein an NO$_2$ spin density of the upper first insulating interlayer is lower than about 5 E+16 spins/cm$^3$.

8. The display device of claim 5, wherein a concentration of hydrogen in the upper first insulating interlayer is greater than about 3.0 E+20 atom/cm$^3$ and lower than about 9.9 E+20 atom/cm$^3$.

9. The display device of claim 1, wherein the second insulating interlayer includes a lower second insulating interlayer including silicon oxide and an upper second insulating interlayer including silicon nitride.

10. The display device of claim 9, wherein a thickness of the lower second insulating interlayer is in a range of about 500 Å to about 5,000 Å.

11. The display device of claim 9, wherein a thickness of the upper second insulating interlayer is in a range of about 1,000 Å to about 5,000 Å.

12. The display device according to claim 9, wherein a concentration of hydrogen in the upper second insulating interlayer is in a range of about 1.19 E+22 atom/cm$^3$ to about 1.28 E+22 atom/cm$^3$.

13. A display device, comprising:
a first active pattern;
a first gate insulation layer covering the first active pattern;
a first gate pattern disposed on the first gate insulation layer;
a second gate insulation layer covering the first gate pattern;
a second gate pattern disposed on the second gate insulation layer and overlapping the first gate pattern;
a first insulating interlayer disposed directly on the second gate pattern;
a second active pattern disposed directly on the first insulating interlayer, the second active pattern including an oxide semiconductor material;
a third gate insulation layer covering the second active pattern;
a third gate pattern disposed on the third gate insulation layer; and
a second insulating interlayer covering the third gate pattern, the second insulating interlayer having a lower second insulating interlayer including silicon oxide and an upper second insulating interlayer including silicon nitride.

14. The display device of claim 13, wherein a thickness of the upper second insulating interlayer is in a range of about 1000 Å to about 5,000 Å.

15. The display device of claim 13, wherein the second active pattern includes indium-gallium-zinc oxide (IGZO) having a thickness in a range of about 150 Å to about 400 Å.

16. The display device of claim 15, wherein a refractive index of the second active pattern is in a range of 1.92 to about 1.93 at a wavelength of 632 nm.

17. The display device of claim 13, wherein the first insulating interlayer includes a lower first insulating interlayer including silicon nitride and an upper first insulating interlayer including silicon oxide.

18. The display device of claim 17, wherein a concentration of hydrogen in the upper first insulating interlayer is greater than about 3.0 E+20 atom/cm$^3$ and lower than about 9.9 E+20 atom/cm$^3$.

* * * * *